(12) United States Patent
Pflum

(10) Patent No.: US 10,084,469 B1
(45) Date of Patent: Sep. 25, 2018

(54) CONTROL SYSTEM AND METHOD FOR A CONFIGURABLE ANALOG TO DIGITAL CONVERTER

(71) Applicant: SILICON LABORATORIES INC., Austin, TX (US)

(72) Inventor: Marty Lynn Pflum, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 15/847,403

(22) Filed: Dec. 19, 2017

(51) Int. Cl.
*H03M 1/38* (2006.01)
*H03M 1/12* (2006.01)
*H03M 3/00* (2006.01)

(52) U.S. Cl.
CPC ............. *H03M 1/38* (2013.01); *H03M 1/124* (2013.01); *H03M 3/458* (2013.01)

(58) Field of Classification Search
CPC .......... H03M 1/38; H03M 1/14; H03M 3/458; H03M 3/00; H03M 1/12; H03M 1/00
USPC ......................... 341/161, 141, 155
See application file for complete search history.

(56) References Cited

U.S. PATENT DOCUMENTS

| | | | | |
|---|---|---|---|---|
| 5,619,201 | A * | 4/1997 | Imakura .................... | G06F 3/05 341/141 |
| 7,126,515 | B1 * | 10/2006 | Kris .................... | H03M 1/1215 341/141 |
| 7,209,066 | B1 * | 4/2007 | Trumbo .................... | H03M 1/1225 341/141 |
| 7,209,069 | B2 * | 4/2007 | Felder .................... | H03M 1/462 341/144 |
| 7,242,335 | B2 * | 7/2007 | Rubin .................... | G06F 1/30 341/141 |
| 9,397,684 | B1 * | 7/2016 | Barrenscheen .......... | H03M 1/129 |
| 9,479,188 | B1 * | 10/2016 | Mason .................... | H03M 1/1225 |

OTHER PUBLICATIONS

Agah, Ali et al. "A High-Resolution Low-Power Incremental ΣΔ ADS With Extended Range for Biosensor Arrays." *IEE Journal of Solid-state Circuits*, vol. 45, No. 6, Jun. 2010 pp. 1099-1110.

* cited by examiner

Primary Examiner — Jean B Jeanglaude
(74) Attorney, Agent, or Firm — Gary Stanford

(57) ABSTRACT

A control system for an analog to digital converter (ADC) including a programmable configuration memory, a trigger selector, an input selector, and a conversion controller. The ADC is configurable for adjusting multiple operating parameters including speed and accuracy. The programmable configuration memory stores at least one configuration variable and an input value. The trigger selector enables at least one trigger input. The input selector selects from among multiple analog inputs according to the programmed input value. The conversion controller configures the ADC using the configuration variable, interfaces the input selector to provide an analog input to the ADC, and interfaces the trigger selector to prompt the ADC to perform a conversion process to provide a digital output sample in response to the enabled trigger input. Multiple entries may be stored, each selecting different analog inputs and corresponding configuration variables, in which the conversion controller dynamically reconfigures the ADC between conversions.

24 Claims, 9 Drawing Sheets

CONTROL SYSTEM AND METHOD FOR A CONFIGURABLE ANALOG TO DIGITAL CONVERTER

BACKGROUND OF THE INVENTION

Field of the Invention

The present invention relates in general to analog to digital conversions, and more particularly to a control system and method for controlling a configurable analog to digital converter (ADC) having multiple operating modes and programmable operating variables.

Description of the Related Art

Many electronic systems incorporate one or more applications that need to convert analog voltages into corresponding digital samples. Some applications may require highly accurate conversions, some applications may require fast conversions, while still other applications may simply need adequate results at an adequate rate. In many conventional configurations, multiple ADCs were provided with different operating characteristics or parameters, each specialized to perform a conversion according to particular specifications, such as one ADC configured for high accuracy, another one configured for high speed, and at least one other ADC for general purpose conversions. The different ADC configurations provided tradeoffs between different operating parameters, such as accuracy, speed, and power consumption. Multiple ADC configurations, however, consumed valuable space and power and were not easily managed or controlled.

SUMMARY OF THE INVENTION

A control system for an analog to digital converter (ADC) according to one embodiment includes a programmable configuration memory, a trigger selector, an input selector, and a conversion controller. The ADC includes an analog input and a digital output and is configurable to adjust multiple operating parameters including speed and accuracy. The programmable configuration memory stores at least one configuration variable and an input value. The trigger selector enables at least one trigger input. The input selector selects from among multiple analog inputs according to the input value programmed in the configuration memory. The conversion controller configures the ADC according to the one or more configuration variables programmed in the configuration memory, interfaces the input selector to provide a selected analog input to the analog input of the analog to digital converter, and interfaces the trigger selector to prompt the ADC to perform a conversion process in response to an enabled trigger input to provide a digital output sample.

In one embodiment, the programmable configuration memory stores multiple entries each including a selected configuration variable and at least one selected analog input value for performing corresponding conversion processes, in which the trigger selector enables at least one trigger input for each entry, the input selector selects from among the analog inputs according to the input value of a corresponding entry, and in which the conversion controller dynamically reconfigures the analog to digital converter according to the configuration variable of a corresponding entry between performing each of the conversion processes.

The at least one configuration variable may include a mode variable for selecting between a normal operating mode, a high accuracy operating mode for increasing an effective number of bits relative to the normal operating mode, and a high speed operating mode for reducing a time for performing the conversion process relative to the normal operating mode. The at least one configuration variable may include an over-sampling rate variable that determines a number of digital values generated by the ADC that are combined to develop the digital output sample. The at least one configuration variable may include a reference variable for selecting from multiple voltage references for use by the ADC when performing the conversion process. The at least one configuration variable may include a clock frequency select variable for selecting a clock frequency of the ADC when performing the conversion process.

The ADC may include an analog front end and a digital pipeline. The at least one configuration variable may include an averaging variable used by the digital pipeline for averaging a number of digital values used to provide the digital output sample. Also, the at least one configuration variable may include a gain variable and an offset variable used by the digital pipeline for adjusting a digital value to provide the digital output sample.

The programmable configuration memory may include a scan table, a single programmable entry, a queue selector, and an enable circuit. The scan table includes programmable entries for sequentially performing corresponding conversions when enabled. The single programmable entry performs a single conversion when enabled. The queue selector is controlled by the conversion controller to select between the scan table and the single programmable entry. The enable circuit is controlled by the conversion controller to enable one of the scan table and the single programmable entry. The programmable configuration memory may include programmable configuration registers, in which the programmable configuration memory stores a configuration value that identifies one of the programmable configuration registers, and in which the identified programmable configuration register stores the at least one configuration variable.

The ADC may include a positive analog input and a negative analog input, in which the input value includes a positive input source and a negative input source for enabling selection between single ended conversions and differential conversions.

An ADC system according to one embodiment includes an ADC, a programmable configuration memory, a trigger selector, an input selector, and a conversion controller. The ADC includes an analog input and a digital output that is configurable for adjusting multiple operating parameters including speed and accuracy. The ADC performs a conversion process to convert an analog value provided at the analog input to a digital output sample provided at the digital output. The programmable configuration memory stores at least one configuration variable and an input value. The trigger selector selects from among multiple trigger inputs. The input selector selects from among multiple analog inputs according to the input value programmed in the configuration memory. The conversion controller configures the ADC according to the at least one configuration variable programmed in the configuration memory, interfaces the input selector to provide the analog value to the analog input of the ADC, and interfaces the trigger selector to prompt the ADC to perform the conversion process in response to a selected trigger input.

The ADC may include an analog front end including a first analog integrator, a second analog integrator, and a quantizer coupled in series for providing first digital values.

The at least one configuration variable may include a mode variable that selects between a high accuracy operating mode, a normal operating mode, and a high speed operating mode. The first digital values are developed using the first analog integrator, the second analog integrator, and the quantizer during the high accuracy operating mode. The first digital values are developed using the first analog integrator and the quantizer during the normal operating mode and the high speed operating mode in which the second analog integrator is bypassed.

The ADC may include a digital pipeline including a first digital integrator that accumulates the first digital values from the analog front end of the ADC to provide second digital values, and a second digital integrator that accumulates the second digital values to provide third digital values. The digital pipeline may develop the digital output value using the third digital values during the high accuracy operating mode, and may develop the digital output value using the second digital values during the normal operating mode and the high speed operating mode in which the second digital integrator is bypassed.

The at least one configuration variable may include an over-sampling rate variable, in which the conversion controller uses the over-sampling rate variable to determine a number of cycles executed by the analog front end and the filter stage of the digital pipeline. The ADC system may include a reference selector that receives multiple voltage references, in which the at least one configuration variable may include a reference variable provided to the reference selector to select and provide a selected voltage reference to the analog front end of the ADC. The ADC may include an analog front end and a digital pipeline that includes an averaging stage, a gain stage, and an offset stage, in which the at least one configuration variable may include a digital averaging variable for use by the averaging stage, a digital gain variable for use by the gain stage, and a digital offset variable for use by the offset stage.

A method of controlling a configurable ADC according to one embodiment includes storing at least one configuration variable and an input value in a programmable configuration memory, selecting and enabling at least one trigger input, selecting from among multiple analog inputs according to the input value stored in the programmable configuration memory, configuring the ADC according to the at least one configuration variable stored configuration memory, providing a selected analog input to the analog input of the ADC, prompting the ADC to perform a conversion process in response to an enabled trigger input to provide a digital output sample.

The method may include storing multiple entries in the programmable configuration memory in which each entry includes an input value and at least one configuration variable, selecting and enabling a trigger input for each entry, selecting from among multiple analog inputs according to the input value of a corresponding entry, dynamically reconfiguring the ADC according to the at least one configuration variable for each entry, providing a selected analog input of to the analog input of the ADC for each entry, and prompting the ADC to perform a conversion process for each entry in response to a corresponding enabled trigger input of a corresponding entry to provide corresponding digital output samples.

The method may include storing a mode variable for selecting between a normal operating mode, a high accuracy operating mode, and a high speed operating mode, and configuring the ADC according to the mode variable. The ADC may include an analog front end and a digital pipeline, in which the method may include storing multiple digital variables, and configuring the digital pipeline according to each of the digital variables.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventor has recognized the need to simplify the conventional analog to digital converter (ADC) configurations needed to perform conversions for different system implementations. He has therefore developed a control system and method for controlling a configurable ADC according to multiple operating parameters based on programmable modes and other programmable configuration variables.

Figure 1:
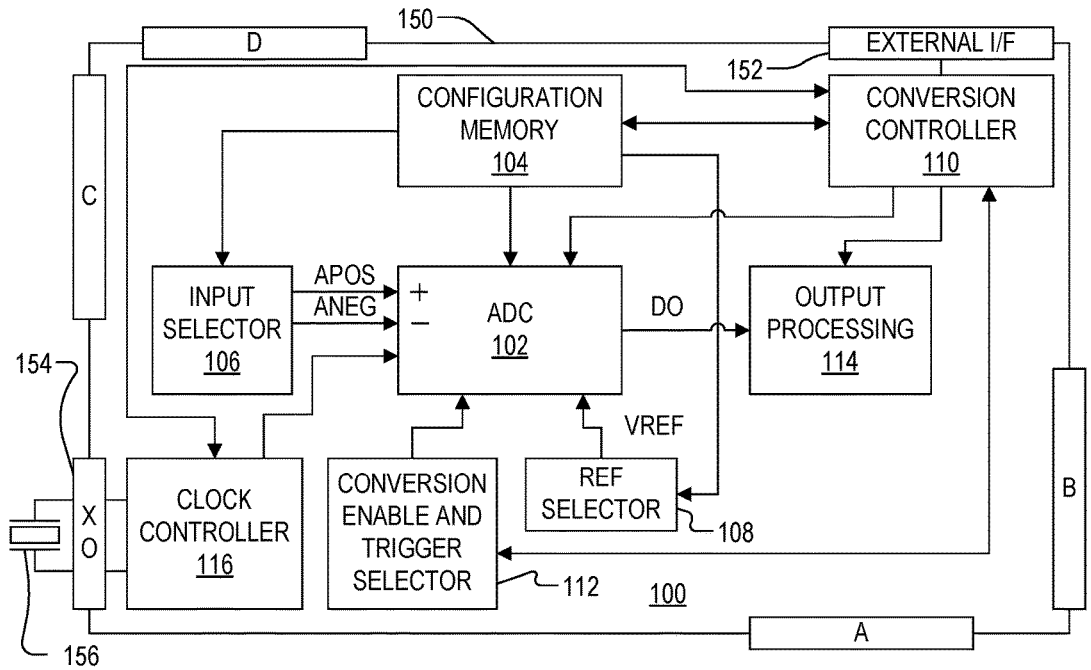
FIG. 1 is a simplified block diagram of an analog to digital (ADC) system implemented according to one embodiment of the present invention.

FIG. 1 is a simplified block diagram of an analog to digital (ADC) system 100 implemented according to one embodiment of the present invention. The ADC system 100 includes a configurable ADC 102 having multiple operating modes each providing corresponding trade-offs between speed, accuracy, and power consumption. Each conversion converts a selected analog voltage or voltage difference into a corresponding digital sample provided on an output DO. In one embodiment, the ADC 102 at least includes a high accuracy mode, a high speed mode, and a normal mode. The high accuracy mode provides higher accuracy conversions at reduced speed or data rate. The high speed mode provides higher data rates with good accuracy at the expense of increased power consumption. The normal mode provides good accuracy at normal data rates and power consumption. The normal mode may be used when very high accuracy and/or very high speed are not necessary. Each mode may operate at any one of multiple data rates with different sampling rates as further described herein.

The ADC system 100 includes a configuration memory 104 used to store multiple variables for each of multiple conversion types according to desired conversion criterion. The stored values may include an input value and at least one configuration variable. In one embodiment, the at least one configuration variable includes a mode variable MD which indicates any one of at least three modes including a high accuracy mode denoted HAM, a normal mode denoted NM, and a high speed mode denoted HSM. Although additional modes may be defined for different applications if desired for different configurations, each mode may be adjusted by programmable back end digital variables to adjust data rate and accuracy as further described herein. The input value is used to identify and connect at least one analog input voltage source provided to the input of the ADC 102. The conversion may be single-ended for converting a single analog voltage relative to a common reference voltage, such as ground (GND), or may be differential for converting a voltage difference between two different analog voltages.

An input selector 106 selects from multiple voltage sources as further described herein based on the at least one input value stored in the configuration memory 104, and the selected analog voltage(s) are provided to one or more corresponding inputs of the ADC 102. In one embodiment, a first selected input is provided as APOS to a positive input of the ADC 102 and a second selected input is provided as ANEG to a negative input of the ADC 102 for both single-ended and differential voltage conversions. In one embodiment, a single input value may be selected for a single-ended conversion and provided as APOS to the positive input of the ADC 102, in which the negative input ANEG is assumed to be GND or the like. In an alternative embodiment, a GND input is separately selected as ANEG for single-ended conversions.

The configuration memory 104 may also store additional variables for controlling the parameters of each conversion depending upon the configuration of the ADC 102 as further described herein. For example, the configuration memory 104 may store a reference variable provided to a reference selector 108 for selecting a corresponding voltage reference VREF used by the ADC 102. Voltage references may include, for example, an internal band-gap voltage reference, an analog supply voltage, or an external voltage reference. The voltage reference VREF is selected based on the type of conversion performed and/or the relative accuracy desired, generally referenced herein as an effective number of bits (ENOB). As described further herein, additional configuration variables may be stored for programming the conversion process, including, for example, an over-sampling rate (OSR) variable, a digital averaging variable, a digital gain variable, and a digital offset variable.

A conversion controller 110 provides a user interface for programming the configuration memory 104 and for generally controlling the conversion timing as further described herein. The conversion controller 110 may be implemented as a central controller with its functions centrally located, or as a distributed controller in which its functions are distributed within the ADC system 100 as desired. The conversion controller 110 interfaces the ADC 102 and the configuration memory 104 for accessing programmable variables and for applying programmed variables to the ADC 102, a conversion enable and trigger selector 112 for controlling timing of the conversions, an output processing block 114 for controlling further processing of the output digital samples, and a clock controller 116 for controlling timing and clocking functions as further described herein. In response to start and stop signals from the conversion controller 110, the conversion enable and trigger selector 112 enables/disables each conversion process and prompts performance of an enabled conversion in response to assertion of a selected one of multiple trigger sources as further described. In one embodiment, once a programmed conversion process is enabled, the conversion begins when prompted by the selected trigger source. Several different trigger sources and corresponding trigger actions may be defined as further described herein.

The output digital samples provided on the output DO are provided to the output processing block 114 for handling each digital output sample as prescribed by a user as further described herein. For example, the output samples may be stored in a memory, transferred to other components in the system, compared with threshold values or the like. The output processing block 114 may be programmed to generate interrupts for various conditions, such as data conversion completions, window comparison results, to provoke direct memory access (DMA) data transfers, programmable buffer data level indicators, data underflow/overflow conditions, timer timeouts, error conditions, etc. The clock controller 116 generates the internal clock signals used by the various circuits ADC system 100 including the ADC 102. The clock controller 116 may include one internal clock generator or may include multiple clock generators, each configured for different purposes.

The ADC system 100 may be implemented on an integrated circuit (IC) 150 or semiconductor chip or the like as part of a larger electronic system (not shown). The IC 150 includes an external interface (I/F) 152 for allowing access to the conversion controller 100 for programming values into the configuration memory 104 and other operating variables and values for controlling conversion operations. The input selector 106 selects from among voltage sources provided from external voltage pads coupled to external ports, shown as ports A, B, C and D, each provided along a corresponding one of the 4 sides of the IC 150. The digital samples provided via output DO to the output processing block 114 may further be externally provided via the external I/F 152, any one or more pins of the ports A-D, or via separate input/output (I/O) interfaces (not shown). In one embodiment, the IC 150 may include an external crystal (XO) interface 154 for coupling an external crystal 156 to the clock controller 116.

Figure 2:
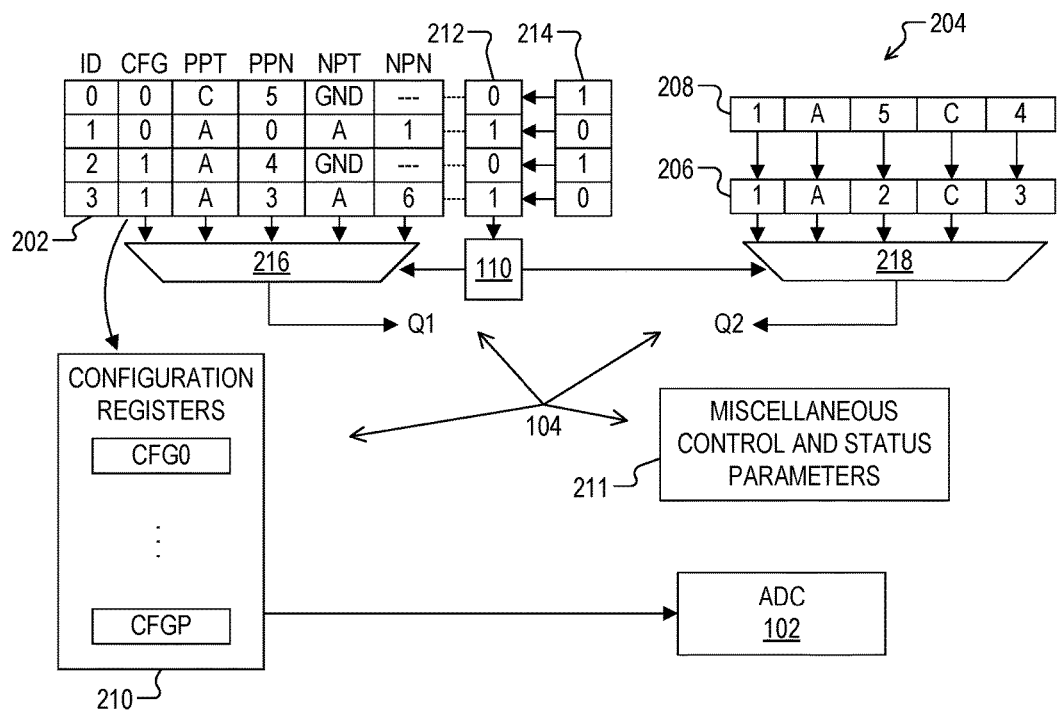
FIG. 2 is a simplified block diagram illustrating further details of the configuration memory coupled to the ADC of FIG. 1 implemented according to one embodiment of the present invention.

FIG. 2 is a simplified block diagram illustrating further details of the configuration memory 104 coupled to the ADC 102 implemented according to one embodiment of the present invention. The configuration memory 104 includes a scan table 202 with multiple entries, a single table 204 with a single entry 206 and a next single entry 208, one or more configuration (CFG) registers 210 for controlling ADC conversions as further described herein, and other miscellaneous control and status parameters 211. Each entry of the scan table 202 includes an identifier (ID) value, a CFG value, and port and pin values for each of positive and negative inputs. The ID value distinguishes between the multiple scan entries shown in numeric order. The scan table 202 is shown with 4 entries with corresponding ID values 0, 1, 2, and 3 (herein referred to as ID0, ID1, ID2 and ID3, respectively), although it is understood that any number more or less than 4 may be included in different configurations. In one embodiment, the scan table 202 includes 16 entries.

In the illustrated embodiment, the CFG value identifies a selected one of the CFG registers 208 for configuring the ADC 102 according to one of many different operating parameters including speed, accuracy, power consumption, etc. As described further herein, for example, the selected CFG register includes the MD variable and one or more additional configuration variables for selecting other operating parameters, such as voltage reference, clock frequency, sampling rate, and other digital control variables as further described herein, such as digital averaging, digital gain, digital offset, etc. The CFG registers 208 includes P+1 registers labeled CFG0 to CFGP in which "P" is a suitable integer greater than 0. Thus, a CFG value of "0" identifies CFG register CFG0, a CFG value of "1" identifies CFG register CFG1, and so on.

Figure 4:
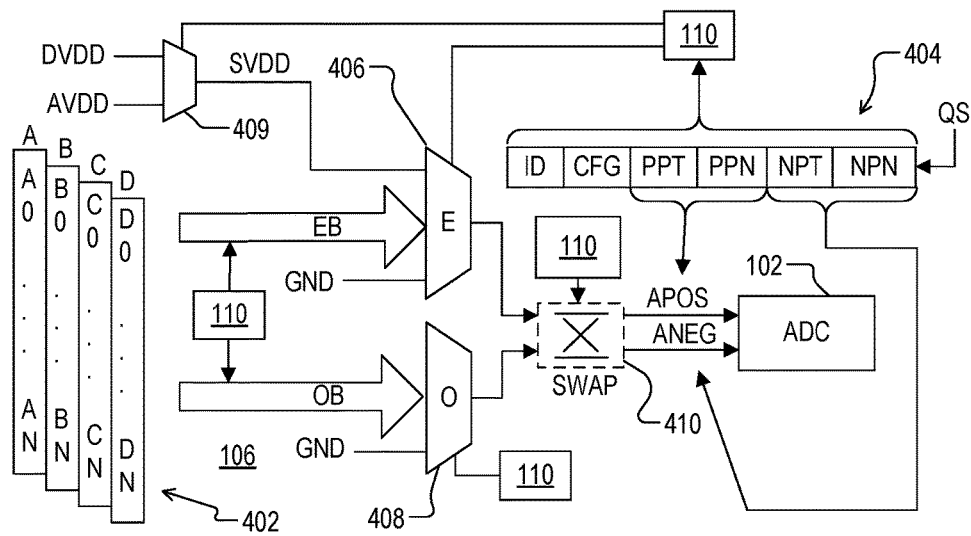
FIG. 4 is a simplified block diagram of the input selector of FIG. 1 implemented according to an embodiment of the present invention receiving the selected entry QS and providing an input interface between the GPIO and the ADC of FIG. 1.

The port and pin input values may be references to voltage pads of a general purpose input/output (GPIO) 402 (FIG. 4). The GPIO 402 includes multiple ports, identified with port letters A, B, . . . , X, each having multiple pins identified by corresponding pin numbers. For example, pin "1" of port "A" references a voltage pad A1 which may simply be referred to as voltage pad A1. The port value may also identify a voltage pad with a specific source voltage value such as GND, or a source voltage selection such as a supply voltage. The supply may be an analog supply voltage AVDD, a digital supply voltage DVDD, or another available supply voltage selected with PPN. Certain sources such as GND may leave the corresponding pin number as unspecified or undefined as indicated by a dash "-" or otherwise ignored.

The scan table 202 shown in FIG. 2 is filled out with arbitrary values for illustrating conversion programming, in which it is understood that each entry is programmable by the user during operation while the scan table 202 is not enabled. As shown, for example, the first entry ID0 in the scan table 202 selects the CFG register CFG0 to program the ADC 102 for converting a voltage between pad C5 and GND, the second entry ID1 in the scan table 202 selects the CFG register CFG0 for converting a voltage difference between pads A0 and A1, the third entry ID2 in the scan table 202 selects the CFG register CFG1 for converting a voltage on pad A4 relative to GND, and the fourth entry ID3 in the scan table 202 selects the CFG register CFG1 for converting a voltage difference between pads A3 and A6.

The configuration memory 104 includes a mask register 212 and a mask request register 214, each having the same number of entries as the scan table 202. Each entry of the mask and mask request registers 212 and 214 is a logic enable bit or the like for enabling or disabling the corresponding entry in the scan table 202. In one embodiment, each bit is a logic "0" for disabling a corresponding entry and a logic "1" for enabling the corresponding entry. The mask register 212 stores the active enable bits for the scan table 202 during operation while the scan table 202 is enabled during a current scan operation, whereas the entries of the mask request register 214 may be updated by the user and then transferred to corresponding entries of the mask register 212 for the next scan operation. As shown, the mask register 212 enables entries ID=1 (or "ID1") and ID3 and disables entries ID0 and ID2 for a current scan operation. The mask request register 214 enables only the entries ID0 and ID2 for the next scan operation (after being transferred to the mask register 212 for the next scan operation).

The configuration memory 104 further includes a scan multiplexer (MUX) 216 controlled by the conversion controller 110 for selecting enabled entries of the scan table 202 as an output entry Q1, one at a time, of the multiple entries of the scan table 202 from top to bottom during a scan conversion operation. For example, assuming all 4 of the entries ID0-ID3 are enabled during a scan conversion, the conversion controller 110 first selects the entry ID0 for a first conversion operation to convert a voltage on pad C5 relative to GND, and when completed, selects the next entry ID for a second conversion operation to convert a voltage difference between pads A0 and A1, and so on until the conversion operations for all of the entries are completed. In the illustrated case, since only entries ID1 and ID3 are enabled according to the mask register 212, the conversion controller 110 skips entry ID0, selects ID1 for a first conversion operation, skips entry ID2, and then selects entry ID3 for a second and last conversion operation for the current scan conversion operation. The scan conversion using entries ID1 and ID3 may be repeated as often as desired while the scan table 202 is enabled. Alternatively, just prior to completion of a scan conversion using ID1 and ID3, the entries in the mask register 212 may be replaced by the entries in the mask request register 214 so that the next scan operation uses ID0 and ID2.

The scan table 202 may only be updated when the ADC 102 is disabled. Although not specifically shown, the miscellaneous control and status parameters 211 may include one or more bits or registers or the like for enabling or disabling the ADC 102. The mask register 212 may be updated at any time when not enabled for scan conversion. When enabled for a current scan operation, however, the scan table 202 remains unmodified. Nonetheless, the mask request register 214 may be updated at any time the ADC 102 is enabled and the mask register 212 may be updated between scan conversions. In this manner, just prior to completion of a current scan operation even while the scan table 202 is enabled, the entries of the mask request register 214 may be transferred to the register 212 for the next scan conversion operation.

Each of the single entry 206 and the next single entry 208 are similar to each of the entries of the scan table 202 except excluding the ID value. The single entry 206 and the next single entry 208 are each filled with arbitrary values for illustration. As shown, the single entry 206 selects the CFG register CFG1 for converting a voltage difference between pads A2 and C3, and the next single entry 208 selects the CFG register CFG1 for converting a voltage difference between pads A5 and C4. A single MUX 218 controlled by the conversion controller 110 selects the single entry 206 as a selected output entry Q2 to perform a single conversion. Initially, the user programs values into the next single entry 208, and while the single entry 206 is not selected (or not enabled), the values from the next single entry 208 are transferred to the single entry 206. While the single entry 206 is enabled for performing a single conversion, the next single entry 208 may be programmed for the next single conversion. At or near the completion of the single conversion using the single entry 206, the next single entry 208 may be transferred to the single entry 206 for the next single conversion. In this manner, back-to-back single conversion operations may be performed in which the user programs the next single entry 208 for the next single conversion while a current single conversion operation is being performed.

The miscellaneous control and status parameters 211 includes one or more types of memory to store other programmable values, variables or parameters for controlling conversion operations. Such parameters may include, for example, control bits, enable bits, status bits, statistical values, etc. The configuration memory 104 may include any combination of read-only memory (ROM), random-access memory (RAM), and may include any combination of static or dynamic memory as desired for a particular configuration. In one embodiment, the miscellaneous control and status parameters 211 includes a set of control or status registers.

Figure 3:
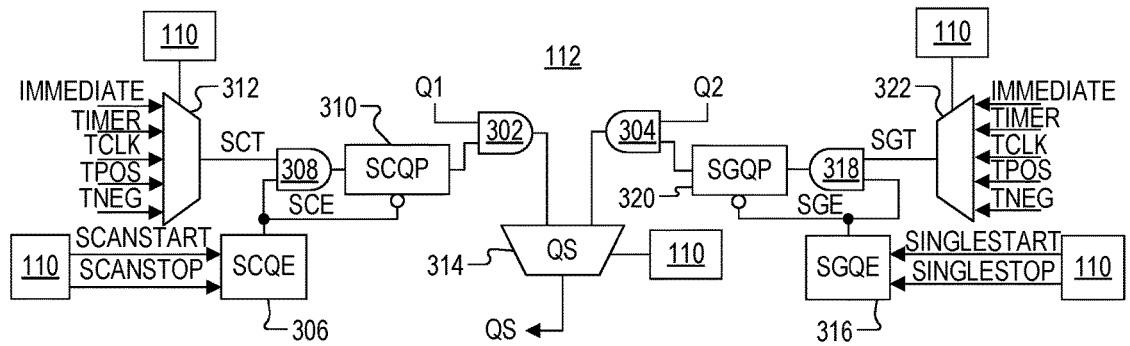
FIG. 3 is a simplified block diagram of the conversion enable and trigger selector of FIG. 1 implemented according to one embodiment of the present invention.

FIG. 3 is a simplified block diagram of the conversion enable and trigger selector 112 implemented according to one embodiment of the present invention. The entry Q1 from the scan MUX 202 is provided to one input of a logic AND gate 302, and the entry Q2 from the single MUX 218 is provided to one input of another logic AND gate 304. It is understood that the Q1 and Q2 entries include each of the corresponding values selected from the scan table 202 or the single entry 206, which are transferred to the output of the corresponding AND gates 302 or 304. The conversion controller 110 provides SCANSTART and SCANSTOP signals to control the state of a scan enable signal SCE provided at the output of a scan queue enable block 306. In one embodiment, SCE goes high in response to a positive pulse on SCANSTART, and SCE goes back low in response to a subsequent positive pulse on SCANSTOP. SCE is provided to one input of a logic AND gate 308 and to the inverted clear input of a scan queue pending block 310. The conversion controller 110 also controls a scan trigger MUX 312 selecting any one of multiple scan trigger sources to provide a selected scan trigger SCT to the other input of the AND gate 308. The output of the AND gate 308 is provided to the data input of the scan queue pending block 310, having an output which is provided to the other input of the AND gate 302. The output of the AND gate 302 is provided to one input of a queue select MUX 314 controlled by the conversion controller 110, in which the queue select MUX 314 has an output providing a selected entry QS, which is a selected one of Q1 or Q2 when enabled.

In a similar manner, the conversion controller 110 provides SINGLESTART and SINGLESTOP positive pulse signals to a single queue enable block 316, which outputs a single enable signal SGE. SGE is provided to one input of a logic AND gate 318 and to the inverted clear input of a single queue pending block 320. The conversion controller 110 also controls a single trigger MUX 322 selecting any one of multiple single trigger sources to provide a selected single trigger SGT to the other input of the AND gate 318. The output of the AND gate 318 is provided to the data input of the single queue pending block 320, having an output provided to the other input of the AND gate 304. The output of the AND gate 304 is provided to a second input of the queue select MUX 314.

The scan trigger sources received by the scan trigger MUX 312 and the single trigger sources received by the single trigger MUX 322 are derived from the same or similar trigger sources. Each of the trigger sources includes an IMMEDIATE trigger, a TIMER trigger based on an internal timer or the like (not shown), a synchronous trigger TCLK based on a selected clock source or the like, an asynchronous positive-edge trigger TPOS, and an asynchronous negative-edge trigger TNEG. This list of trigger sources is exemplary only and not intended to be exhaustive in which other types of trigger sources may be defined and used.

In operation of the conversion enable and trigger selector 112, the scan queue enable block 306 and the single queue enable block 316 are both initially disabled by default so that SCE and SGE are both negated low. The scan and single queue pending blocks 310 and 320 are both cleared so that their respective outputs block or otherwise disable the Q1 and Q2 entries. The outputs of the AND gates 308 and 318 are also low and any trigger sources selected by the conversion controller 110 are ignored. The conversion controller 110 controls the MUX 312 to select a scan trigger source and asserts SCANSTART high (or pulses SCANSTART high) to enable a scan operation, so that SCE is asserted high. It is noted that in one embodiment, the selected trigger sources and corresponding options may be programmed by the user and stored in the miscellaneous control and status parameters 211. As soon as the selected trigger is asserted, SCT goes high so that the AND gate 308 asserts its output high. In response, the output of the scan queue pending block 310 goes high so that the entry Q1 is passed to the queue select MUX 314. Assuming the single queue is disabled and that no other conversion process is active, Q1 is passed as the selected entry QS.

As previously described, once enabled and in response to assertion of the selected trigger, the conversion controller 110 initiates and controls a scan conversion operation by sequentially stepping through enabled entries of the scan table 202 and performing back to back conversion operations. Each conversion process converts the analog input to a corresponding digital sample on DO. A trigger action variable may be set as ONCE in which only a one scan conversion is performed in response to the trigger. After completion of the current scan conversion, the scan process is repeated in response to assertion of another trigger source while the scan queue enable block 306 remains enabled. When the selected trigger is IMMEDIATE, then the scan conversion begins as soon as enabled. The trigger action variable may also be CONTINUOS, in which the scan conversion is repeated in sequential fashion until disabled. Scan conversion operations may be performed or otherwise repeated in this manner until the conversion controller 110 asserts SCANSTOP to disable the scan queue enable block 306 and correspondingly terminate the scan conversion operations.

Operation of the single conversion process is similar except that only a single conversion is performed to provide a single digital sample, although the single conversion may be repeated depending upon the selected trigger options to produce multiple digital samples. The conversion controller 110 controls the MUX 322 to select a single trigger source and asserts SINGLESTART high (or pulses SINGLESTART high) to enable the single queue enable block 316 for a single conversion operation, in which SGE is asserted high. As soon as the selected trigger is asserted, SGT goes high so that the AND gate 318 asserts its output high. If the selected trigger source is IMMEDIATE, then it is considered asserted when enabled. In response to assertion of the selected trigger (or as soon as enabled if the trigger source is IMMEDIATE), the output of the single queue pending block 320 goes high so that the entry Q2 is passed to the queue select MUX 314. Assuming the scan queue is disabled and that no other conversion process is active, Q2 is passed as the selected entry QS and the corresponding single conversion is performed. While the single queue enable block 316 remains enabled, additional single conversions may be performed. For example, if the trigger action is ONCE, then another single conversion is performed for each assertion of the selected trigger source. If the trigger action is CONTINUOUS, then the single conversion repeats one after another without delay between conversions. Single conversion operations may be performed or otherwise repeated in this manner until the conversion controller 110 asserts SINGLESTOP to disable the single queue enable block 316 and correspondingly terminate the single conversion operations.

FIG. 4 is a simplified block diagram of the input selector 106 implemented according to an embodiment of the present invention receiving the selected entry QS and providing an input interface between the GPIO 402 and the ADC 102. The selected entry QS is loaded into an active entry 404, including the ID, the selected configuration register CFG, the positive port (PPT) and corresponding positive pin (PPN), and the negative port (NPT) and corresponding negative pin (NPN). The values within the active entry 404 are used by the conversion controller 110 for input selection as further described herein. The ID value is only valid for entries from the scan table 202 and may be undefined or unused for an entry from the single entry 206, or otherwise designated as "SINGLE". The PPT and PPN values are used to select the APOS input of the ADC 102 and the NPT and NPN values are used to select the ANEG input of the ADC 102. The conversion controller 110 decodes or otherwise converts the PPT/PPN and NPT/NPN values to control a set of MUXes 406, 408, and 409, an even switch bus EB and an odd switch bus OB, and a two-state swap gate 410 to provide selected inputs to the APOS and ANEG inputs of the ADC 102. In the illustrated embodiment, the inputs are selected from GND, the GPIO 402, and source voltages DVDD and AVDD.

The GPIO 402 includes 4 ports A-D in which each of the ports includes N pins (e.g., port A includes pins A0 to AN, port B includes pins B0 to BN, port C includes pins C0 to CN, and port D includes pins D0 to DN. Any different number of ports and/or pins may be defined and the different ports may include a different number of pins. In one embodiment, the ADC system 100 is implemented on the IC 150 with 4 sides as shown in FIG. 1, in which each of the 4 ports corresponds to one of the 4 sides of the IC 150. In the illustrated embodiment, the even-numbered pins of the ports A-D may be coupled to selected inputs of the even input select MUX 406 via the even switch bus EB, and the odd-numbered pins of the ports may be coupled to selected inputs of the odd input select MUX 408 via the odd switch bus OB. The even and odd switch buses EB and EO may each include pass gates or analog MUXes or the like to make the connections between the selected voltage pads (identified by port and pin) to inputs of the MUXes 406 or 408. Each of the MUXes 406 and 408 also include a GND input for single-ended conversions.

The source MUX 409, controlled by the conversion controller 110, selects either the digital source voltage DVDD or the analog source voltage AVDD, and the selected source voltage is output as SVDD and provided to another input of the even MUX 406. Although only two source voltages are shown, it is understood that additional source voltages may be provided to inputs of the source MUX 409. In one embodiment, in order to make a source voltage selection, the user specifies the PPT value as "VSUPPLY" rather than a positive port and PPN selects the specific supply voltage, such as AVDD or DVDD or the like. In one embodiment, the corresponding NPT value is GND for a source voltage selection. In another embodiment, the corresponding NPT value may be left blank or unspecified and assumed by the conversion controller 110 to be GND.

The swap gate 410 is controlled by the conversion controller 110 to couple any selected even input from the even MUX 406 to APOS or ANEG and to correspondingly couple any selected odd input from the odd MUX 408 to ANEG or APOS as determined by the PPT/PPN and NPT/NPN values in the active entry 404. In a first state of the swap gate 410, the output of the even MUX 406 is coupled to APOS while the output of the odd MUX 408 is coupled to ANEG. In a second state of the swap gate 410, the output of the even MUX 406 is coupled to ANEG while the output of the odd MUX 408 is coupled to APOS. The PPT/PPN values may select any input provided through the even MUX 406 while the NPT/NPP values select any input provided through the odd MUX 408 or vice-versa (i.e., in which the PPT/PPN values select an input provided through the odd MUX 408 while the NPT/NPP values select an input provided through the even MUX 406). In this manner, the user may select an even voltage pad or an odd voltage pad in either of the PPT/PPN and NPT/NPP values. The PPT/PPN and NPT/NPP values may not, however, both select source voltages (e.g., DVDD and AVDD), and may not both select two even inputs or two odd inputs. In one embodiment, the conversion controller 110 may provoke an interrupt in the event of an illegal selection.

Figure 5:
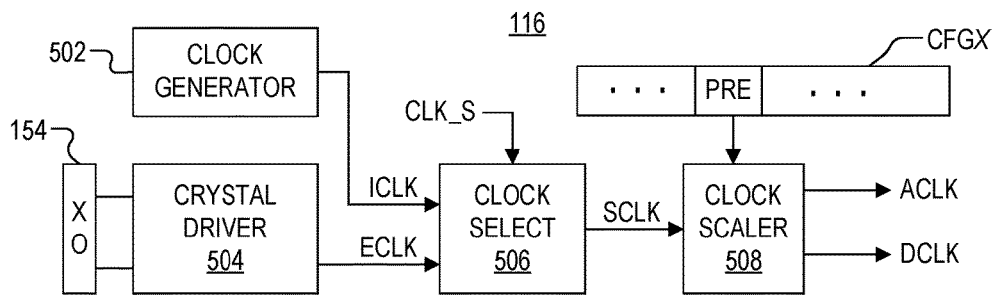
FIG. 5 is a more detailed block diagram of the clock controller of FIG. 1 according to one embodiment of the present invention.

FIG. 5 is a more detailed block diagram of the clock controller 116 according to one embodiment of the present invention. The illustrated clock controller 116 includes an internal clock generator 502 developing an internal clock signal ICLK provided to an input of a clock select block 506. If the external crystal 156 is provided, it is coupled through the external crystal interface 154 to an internal crystal driver 504, which develops an "external" clock signal ECLK provided to another input of the clock select block 506. The clock select block 506 receives a clock select value CLK_S for selecting either ICLK or ECLK and providing a selected clock signal SCLK to a clock scaler 508. A selected configuration register CFGX includes a "prescaler" variable PRE provided to an input of the clock scaler 508, which outputs clock signals ACLK and DCLK. The PRE variable serves as a clock frequency select variable as further described herein. As described further herein, ACLK may be used by an analog portion of the ADC 102 and DCLK may be used by a digital portion of the ADC 102.

Although ECLK is an internally generated signal, it is developed using the externally provided crystal 156 in order to provide greater clock accuracy and/or higher frequency. ICLK may be internally generated using a resistor-capacitor (RC) circuit or the like (not shown), and has a suitable frequency with sufficient accuracy for most conversion operations. In one embodiment, ICLK has a frequency of 40 MegaHertz (MHz), although any suitable clock frequency is contemplated. The user programs CLK_S, such as located within the miscellaneous control and status parameters 211, to select ICLK or ECLK for providing the selected clock SCLK. The clock scaler 508 divides the frequency of SCLK based on the PRE variable to a suitable frequency level for a given conversion operation. When the MD variable indicates the high accuracy mode HAM, the maximum allowed frequency for operating the ADC 102 is lower than when the MD variable indicates the high speed mode HSM. For example, in one embodiment for HSM conversions, the maximum allowed frequency is 20 MHz, whereas for HAM conversions, the maximum allowed frequency is only 5 MHz. In this example, if SCLK is 40 MHz, then PRE is programmed to divide SCLK by 2 for HSM conversions and is programmed to divide SCLK by 8 for HAM conversions.

Figure 6:
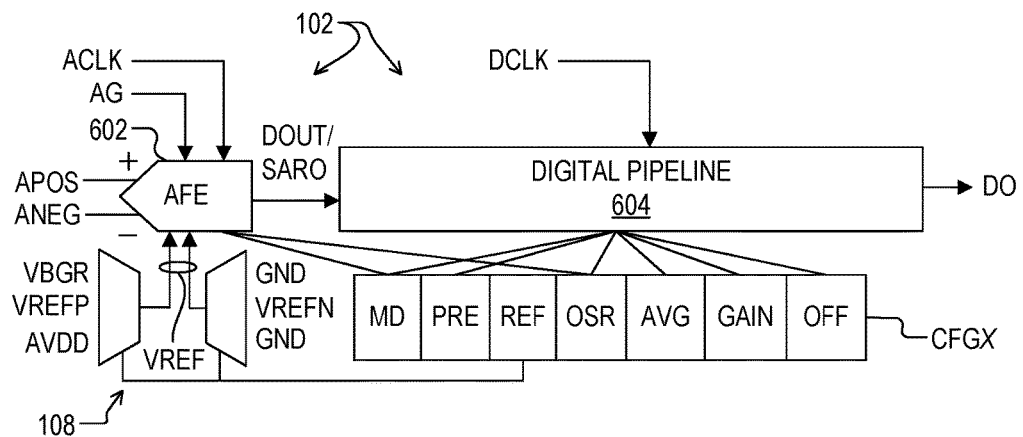
FIG. 6 is a more detailed block diagram of the ADC and the reference selector of FIG. 1, and a selected configuration register of the configuration registers of FIG. 2 for configuring the of FIG. 1 according to one embodiment of the present invention.

FIG. 6 is a more detailed block diagram of the ADC 102, the reference selector 108, and the selected configuration register CFGX of the configuration registers 210 for configuring the ADC 102 according to one embodiment of the present invention. In one embodiment, the ADC 102 includes an analog front end (AFE) 602 and a digital back end or digital pipeline 604. The AFE 602 receives the clock signal ACLK and input signals APOS and ANEG and provides digital values on outputs DOUT and SARO. The digital pipeline 604 has a clock input receiving DCLK, has data inputs receiving DOUT and SARO, and has an output providing final digital samples on DO. Each of the configuration registers 210, illustrated by the selected configuration register CFGX, may include a set of variables for controlling each ADC conversion, including the mode variable MD, a reference variable REF, the PRE variable, an over-sampling rate variable OSR, an averaging variable AVG, a gain variable GAIN, and an offset variable OFF.

The MD variable controls the AFE 602 and the digital pipeline 604 into one of several modes, including, for example, the high accuracy mode HAM, the normal mode NM, and the high speed mode HSM. Additional modes may be defined for different applications if desired for different configurations. The PRE variable essentially selects the corresponding frequency of ACLK used by the AFE 602 for each conversion process as previously described. The digital pipeline 604 uses PRE to operate at the same clock frequency while receiving information from the AFE 602, although the digital pipeline 604 may operate at higher frequencies when performing back-end calculations. The REF variable selects from among multiple different voltage references of the reference selector 108 for providing VREF to the AFE 602. Voltages references may include, for example, an internal band-gap voltage reference VBGR relative to GND, the analog supply voltage AVDD relative to GND (or any other analog supply voltage), or an external differential voltage reference including a positive polarity VREFP relative to a negative polarity VREFN. In one embodiment, VBGR is an internal band-gap voltage reference, such as 1.21 Volts (V) or the like. The voltage reference VREF is selected based on the type of conversion performed and/or the relative accuracy desired, generally referenced herein as an effective number of bits (ENOB).

The OSR variable defines the oversampling rate of the AFE 602 and at least one digital filter in a filter stage 801 (FIG. 8) within the digital pipeline 604, generally meaning the number of cycles and corresponding digital values provided on DOUT that are used to develop each digital sample on DO. In one embodiment, the OSR variable ranges from 2× to 64× for normal and high speed modes, and from 16× to 256 for the high accuracy mode. For each mode, the greater the OSR variable, the slower the output data rate and the higher the accuracy as further described herein. The AVG variable determines the number of digitally filtered values averaged within an averaged value. In one embodiment, the AVG variable ranges from 1× to 16× in which 1× means that the values pass through the digital pipeline 604 without averaging. The GAIN and OFF variables may provide correction for process variations or the like, second order filter gains, built-in offsets, etc. The ranges or selected values of the GAIN and OFF variables may depend upon the particular implementation.

Also, additional control signals may be included and/or defined for controlling ADC conversion. For example, an analog gain (AG) variable may be provided to the AFE 602 for adjusting input gain to one of several discrete levels depending upon the relative magnitude of the input voltages. As an example, AG may be greater than 1 for low voltage signals or less than 1 for large input voltage levels. A set of discrete AG gain settings may be predefined (e.g., 0.5×, 0.75×, 1×, 1.25×, 1.5×, 2×, 4×, etc.).

Figure 7:
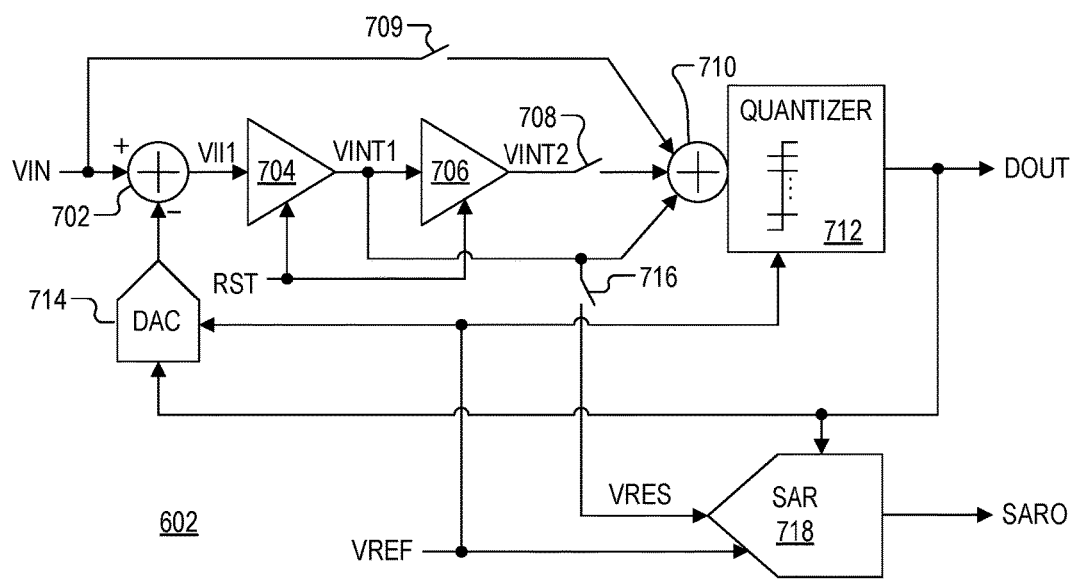
FIG. 7 is a simplified schematic and block diagram illustrating additional details of the analog front end of FIG. 6 implemented according to one embodiment of the present invention.

FIG. 7 is a simplified schematic and block diagram illustrating additional details of the AFE 602 implemented according to one embodiment of the present invention. In the illustrated embodiment, the ADC 102 is implemented as a configurable incremental ADC (iADC) in which the AFE 602 is configured as a delta-sigma ($\Delta\Sigma$) modulator. The analog input values VPOS and VNEG are collectively shown as a voltage VIN for simplicity, where it is understood that the AFE 602 portion of the ADC 102 is configured for both single-ended and differential voltage conversions to digital format. The AFE 602 includes an analog pipeline including an adder 702, a first analog integrator 704, a second analog integrator 706, another adder 710, and a quantizer 712. VIN is provided to one input of the adder 702, having another input receiving a feedback voltage VFB and having an output providing a difference signal VII1=VIN−VFB to an input of the analog integrator 704. The integrator 704 integrates VII1 and has an output providing a first integrated voltage (VINT1) to an input of the second integrator 706. The integrator 706 integrates VINT1 and has an output providing a second integrated voltage (VINT2) through an electronic switch 708 to one input of the adder 710. The adder 710 has inputs receiving the voltages VIN, VINT2 and VINT1 and has an output providing a sum voltage to an input of the quantizer 712. Another electronic switch 709 selectively provides VIN to the adder 710.

The quantizer 710 quantizes the sum voltage and provides digital output values on DOUT, which are fed back to an input of a digital to analog converter (DAC) 714. In one embodiment, the quantizer 712 is a 4-bit quantizer, although alternative resolutions are contemplated for different configurations. The DAC 714 converts each digital output value from DOUT to update VFB, in which VFB is provided to a negative or inverting input of the adder 702 to be subtracted from VIN during each iteration. The AFE 602 further includes an electronic switch 716 for selectively providing VINT1 as a residual voltage VRES to the input of a successive approximation register (SAR) 718, having an output providing a digital output value SARO. In the simplified diagram, DOUT is also shown provided to the SAR 718 for processing the residual as further described herein. The selected voltage reference VREF is provided to the DAC 714, the quantizer 712, and the SAR 718. A reset signal RST is provided to the analog integrators 704 and 706.

Operation of the AFE 602 depends upon the MD, PRE, and OSR variables, and the relative accuracy of the results depends upon the selected VREF. The AFE 602 may operate at a higher frequency as compared to the HAM mode as determined by PRE setting the frequency of ACLK. When the MD variable is NM for the normal mode or HSM for the high speed mode, operation is substantially similar. For both of these modes, the electronic switch 708 remains open to effectively remove the second integrator 706. In alternative configurations, the second integrator 706 may be disabled or have its output set to zero. The electronic switch 709 is initially closed and the electronic switch 716 is initially open. The AFE 602 is operated for OSR cycles to develop a series of digital output values on DOUT. In a first cycle, VIN is provided to the first integrator 704 and fed forward to the adder 710 and quantized to a first digital value. In subsequent sequential OSR cycles, each digital value developed on DOUT is converted to VFB and subtracted from VIN by the adder 702 to update VII1. Also during the subsequent sequential OSR cycles, the VINT1 voltage is developed by the integrator 704 and added to VIN by the adder 710, in which the sum is quantized by the quantizer 712 to develop the digital values on DOUT. The switch 708 remains opened so that VINT2 is not used during the normal and high speed modes.

After the OSR cycles have completed, the electronic switch 709 is opened to remove VIN as an input to the adder 710, and the AFE 602 is operated for one or more cycles until VINT1 is quantized and provided as a digital residual value on DOUT. As described further below, this digital residual value is temporarily stored in a register 808 (FIG. 8) or the like. Also, the electronic switch 716 is closed and the VINT1 voltage is sampled by the SAR 718 as VRES. The digitized residual on DOUT is subtracted from VRES and the difference is processed by the SAR 718 and provided as the other digital output value SARO. The digital values provided on DOUT during the OSR cycles are used to develop the upper or most significant bits (MSBs), whereas the residual value developed on SARO is used to develop the remaining least significant bits (LSBs), although there may be overlap providing some redundancy between the residual developed on DOUT and the SARO value. In one embodiment, SARO is used to develop the lower 8 significant bits while DOUT develops the remaining higher number of significant bits of each digital output sample. It is noted that the effective number of bits (ENOB) depends upon the OSR among other factors. When OSR is only 2×, then the ENOB is only about 11 bits, although the overall data rate is increased. As OSR is increased for the normal or high speed modes, the ENOB may be increased up to about 14 bits, although the resulting data rate is decreased. The normal and high speed modes are substantially the same, except that the high speed mode is operated with significantly increased power to increase the overall data rate. Generally, the data rate of the high speed most is about double that of the normal mode with about the same ENOB.

When the MD variable is HAM for the high accuracy mode, the electronic switch 716 remains open and the SAR 718 is not used. The electronic switch 708, on the other hand, remains closed and the second integrator 706 is placed into the loop to improve accuracy. In general, the second integrator 706 further processes the input signal to reduce noise and increase accuracy at the cost of a lower sample rate. The electronic switch 709 is operated in the same manner as the normal and high speed modes. Operation is substantially similar during the OSR cycles, except that VINT1 is further integrated by the second integrator 706 to produce VINT2, which is added by the adder 710 to develop the sum voltage provided by the adder 710 and quantized by the quantizer 712 during each of the subsequent sequential cycles. After the OSR cycles, the electronic switch 709 is opened to remove VIN and the VINT1 voltage is further processed through the second integrator 706 to provide a digital residual value. In the second order system including the second integrator 706, the digital filtering also includes a second digital integrator as further described herein. In one embodiment, the OSR is at least 16× to achieve an ENOB of 12 bits. As the OSR is increased for the high accuracy mode, the accuracy is increased up to an ENOB of about 15 bits at the cost of a reduced data rate. The digital processing, including digital averaging, may be used to further increase the accuracy with an ENOB up to almost 16 bits.

Figure 8:
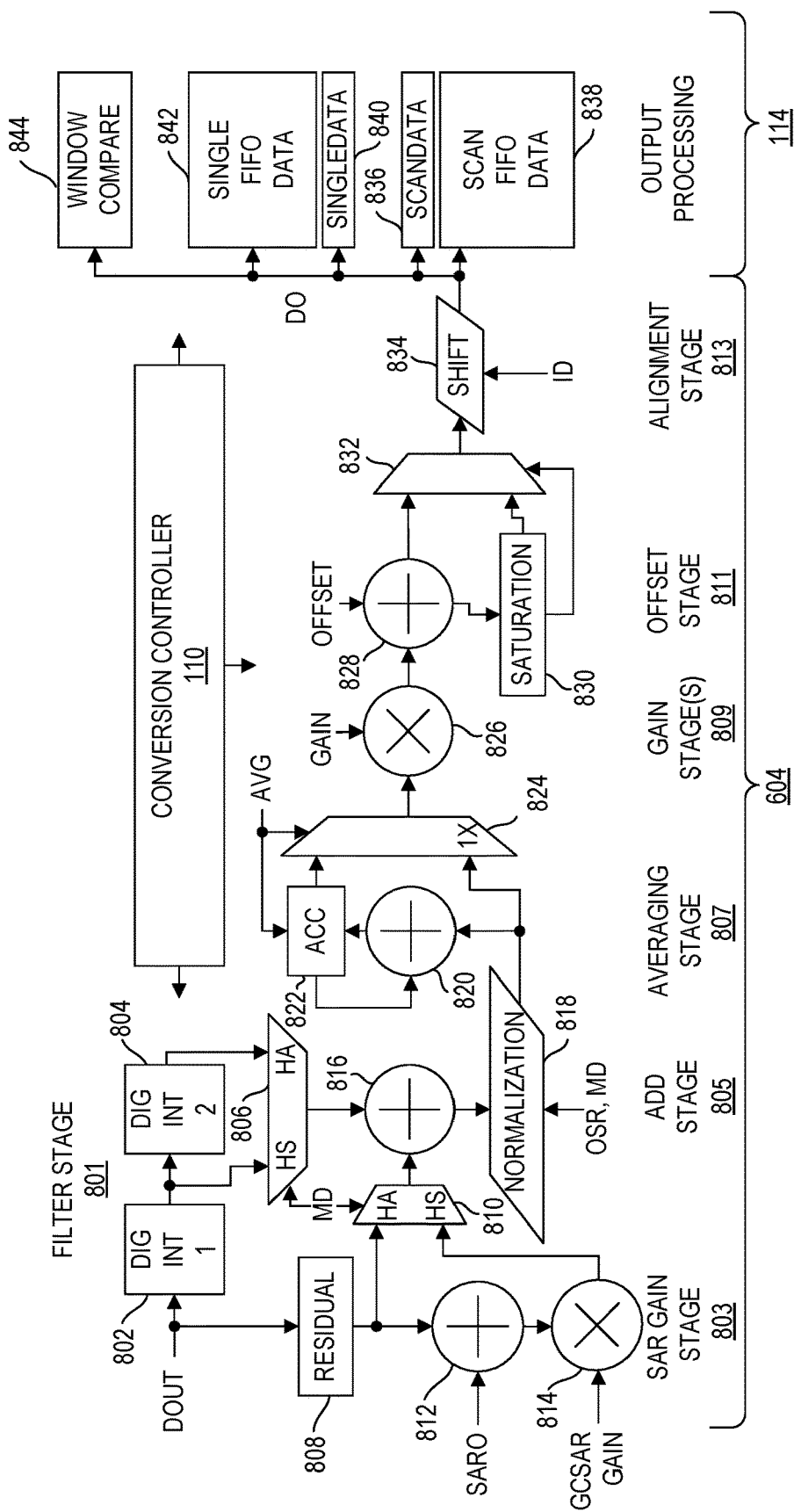
FIG. 8 is a block diagram illustrating further details of the digital pipeline of FIG. 6 and the output processing block for the ADC of FIG. 1 configured as an incremental ADC according to one embodiment of the present invention.

FIG. 8 is a block diagram illustrating further details of the digital pipeline 604 and the output processing block 114 for the ADC 102 configured as an incremental ADC according to one embodiment of the present invention. In this embodiment the digital pipeline 604 is implemented with multiple stages, including a filter stage 801, a SAR gain stage 803, an add stage 805, an averaging stage 807, a gain stage 809, an offset stage 811, and an alignment stage 813. The entire process for each conversion may be controlled by the conversion controller 110. In one embodiment, the conversion controller 110 incorporates a digital state machine or the like for controlling the digital pipeline 604 using variables from the selected configuration register, such as CFGX, and the output processing block 114. The digital pipeline 604 operates using DCLK, which has the same frequency as ACLK when receiving values on DOUT and SARO from the AFE 602. It is noted, however, that the digital pipeline 604 may operate at a much higher frequency than the AFE 602. In one embodiment, the frequency of DCLK may be set at a multiple of ACLK, in which the frequency of DCLK is decreased (e.g., divided down) when the digital pipeline 604 interfaces the AFE 602, and then returned to normal for back end digital processing for developing DO. The adjustment of the frequency of DCLK may be performed within the clock scaler 508 and/or the digital pipeline 604.

The digital values developed on DOUT are provided to the input of a first digital integrator (DIG INT 1) 802 of the filter stage 801, having an output provided to the input of a second digital integrator (DIG INT 2) 804 of the filter stage 801. The first and second digital integrators 802 and 804 may each be configured as a digital accumulator. For example, each digital filter 802 and 804 may include an accumulation register (not shown) and a two-input digital adder (not shown). In one particular configuration of the digital integrators, for example, the input of each digital integrator is provided to one input of its digital adder, having its other input receiving the digital value stored in its register, and having its output providing a sum value which is stored back into its register. Thus, the digital value provided at the input is "accumulated" or added to the value of the register in each cycle for each of the digital integrators 802, 804. In this manner, the first digital integrator 802 accumulates the digital values developed on DOUT and provides a first accumulated value at its output, whereas the second digital integrator 804 accumulates the accumulated values provided from the output of the first digital integrator 802 and provides a second accumulated value at its output. The accumulated values are subsequently normalized for digital averaging so that the digital integrators operate as digital filters.

The output of the first digital integrator 802 is provided to an HS input of a MUX 806, the output of the second digital integrator 804 is provided to an HA input of the MUX 806, and the MUX is controlled by MD. In the normal and high speed modes, MD selects the HS input of the MUX 806 for using the first accumulated value from the first digital integrator 802 and the second digital integrator 804 is bypassed or otherwise not used. In the high accuracy mode, the MD variable selects the HA input of the MUX 806 for using the second accumulated value from the second digital integrator 804.

After the OSR cycles for any of the operating modes, the digital residual value developed on DOUT from the AFE 602 is latched into the register 808. The residual value from the register 808 is provided to an HA input of another MUX 810 and to an input of an adder 812 of the SAR gain stage 803, which also includes a multiplier 814. The adder 812 adds the SARO value with the residual value from the register 808 and provides a sum value to the multiplier 814, which multiplies the sum value by a gain value GCSAR and provides the multiplied value to an HS input of the MUX 810. The MUX 810 is controlled by the MD variable in the same manner as the MUX 806. The gain value GCSAR may be a programmable value by the user or may be a fixed value for adjusting the gain of the SAR 618 relative to the remaining portions of the ΔΣ modulator providing DOUT. The MD variable selects the HS inputs of the MUXes 806 and 810 for the normal and high speed modes and selects the HA inputs for the high accuracy mode. Thus, in the normal or high speed modes, the residual value is added to SARO and the sum is multiplied by the SAR gain GCSAR and provided as the output of the MUX 810. In the high accuracy mode, the SAR gain stage 803 is bypassed in which the residual from the register 808 is provided at the output of the MUX 810.

The add stage 805 includes an adder 816 and a normalization block 818. The adder 816 adds the outputs of the MUXes 806 and 810 together and provides the sum to an input of the normalization block 818, which normalizes the sum value based on the OSR variable and the MD variable. Since the first digital integrator 802 accumulates the digital values and the second digital integrator 804 further accumulates the accumulated output of the first digital integrator 802, the normalization block 818 performs various digital shift and/or division functions to normalize the digital value depending upon the mode of operation.

The averaging stage 807 includes an adder 820, an accumulator 822, and a MUX 824. The output of the normalization block 818 is provided to a 1× input of the MUX 824 and to one input of the adder 820. The output of the adder 820 is provided to the input of the accumulator 822, having a first output coupled to another input of the adder 820 and a second output coupled to the other input of the MUX 824. The AVG variable is shown provided to the accumulator 822 and to a control input of the MUX 824. In operation, when AVG is 1× for no digital averaging, then the 1× input of the MUX 824 is selected so that the output of the normalization block 818 passes unchanged to the output of the MUX 824. When AVG is greater than 1×, then the second input of the MUX 824 is selected so that the second output of the accumulator 822 is selected as the output of the MUX 824. The adder 820 adds each new value to the contents of the accumulator 822 provided from its first output and stores the result back into the accumulator 822 up to the AVG number. Then the accumulated result is divided by AVG (using digital divide or shift or the like) and output through the MUX 824.

The gain stage 809 includes at least one gain block 826 for multiplying the output of the MUX 824 by the GAIN variable to provide a multiplied value at its output. The offset stage 811 includes an adder 828, a saturation block 830, and a MUX 832. The output of the gain block 826 is provided to one input of the adder 828, which receives the OFF variable at its other input for providing an adjusted value to a first input of the MUX 832. The adder 828 also has a second output provided to an input of the saturation block 830, having its output provided to a second input of the MUX 832. If for any reason the gain is too high so that the output of the adder 828 overflows, the saturation block 830 provides a saturation value (e.g., maximum digital value) at its output to the MUX 832. The saturation block 830 controls the MUX 832 to select the output of the adder 828 when there is no overflow, but otherwise selects the output of the saturation block 830.

The output of the MUX 832 is provided to a shift block 834 of the alignment stage 813. The shift block 834 generally performs right or left shifting to get the decimal point of the output digital sample DO at a user-specified location. Basically, each digital sample on DO is configured into a right-shifted or left-shifted format, and may be in a normal format or 2's complement format or the like. If the conversion was for a scan operation, then the shift block 834 may also incorporate the ID value for storing the result.

The output digital sample is provided via DO to the output processing block 114. The output processing block 114 is shown in simplified form including a scan data register 836, a scan first-in, first-out (FIFO) buffer 838, a single data register 840, a single FIFO buffer 842, and a window compare block 844. The digital sample on DO for each scan conversion may be stored into the scan data register 836 and pushed into the FIFO buffer 838. Alternatively, the digital sample on DO for each single conversion may be stored into the single data register 840 and pushed into the single FIFO buffer 842. In addition or in the alternative (as specified by the user), the digital sample on DO may be provided to the window compare block 844 for comparison with one or more window thresholds or the like. For example, the user may specify upper and/or lower threshold values in which an interrupt or the like is generated depending upon the comparison results.

Figure 9:
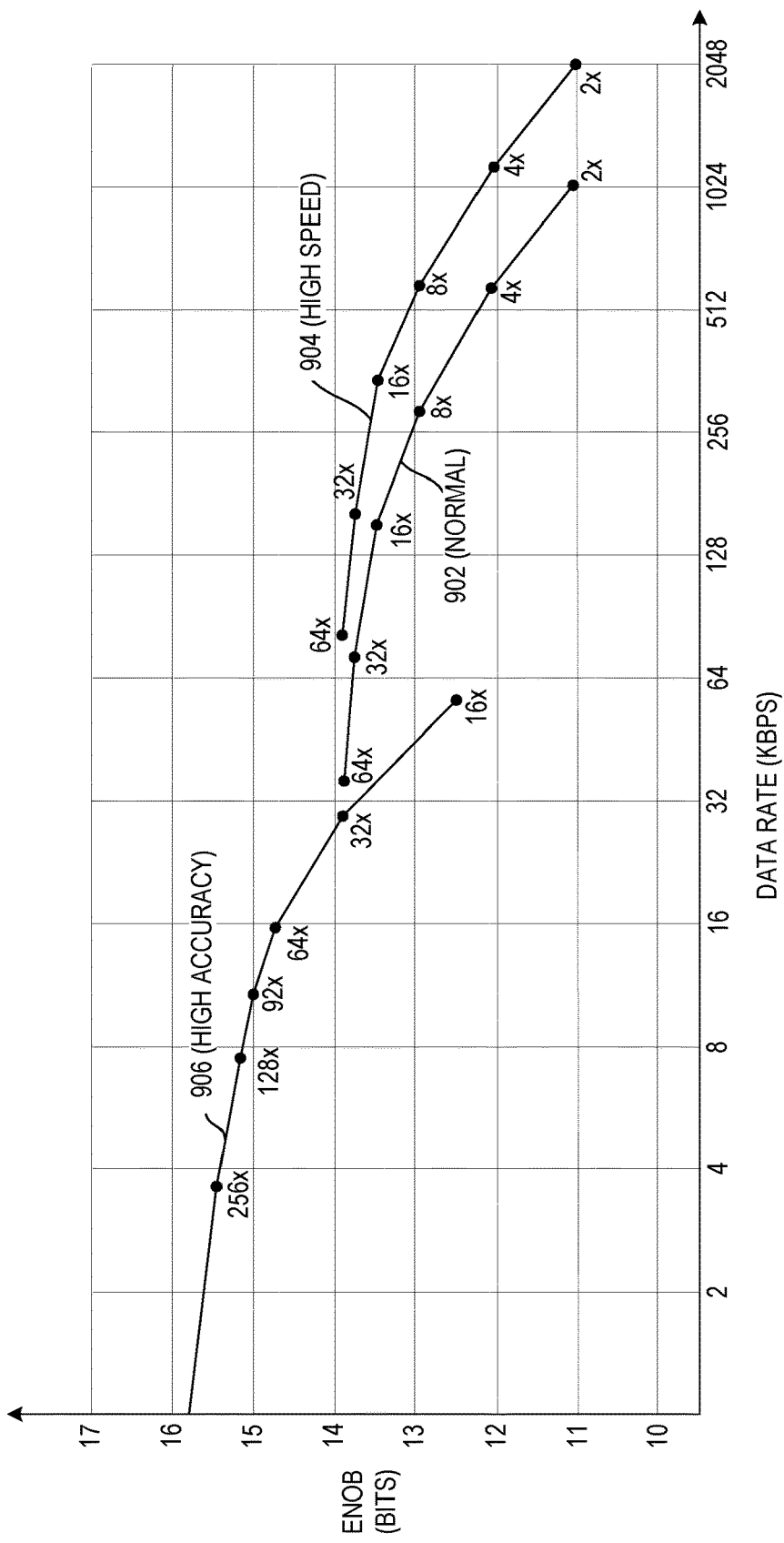
FIG. 9 is a graphic diagram comparing ENOB (in bits) versus data rate (in kilosamples per second) for several different modes and OSR variables of the ADC system of FIG. 1 according to one embodiment of the present invention.

FIG. 9 is a graphic diagram comparing ENOB (in bits) versus data rate in kilosamples per second (ksps) for several different modes and OSR variables of the ADC system 100 according to one embodiment of the present invention. A normal mode curve 902 illustrates results for the normal mode of operation for OSR variables of 2×, 4×, 8×, 16×, 32× and 64×. When the OSR variable is low, such as 2×, the ADC system 100 provides a relatively high data rate, such as about 1,024 ksps, although the ENOB is relatively low, such as only about 11 bits. As the OSR variable is increased, the data rate correspondingly decreases. For example, the data rate is cut in half to about 512 ksps for an OSR variable of 4× to achieve about 12 bits of accuracy. Almost 14 bits of accuracy may be achieved using an OSR variable of 64×, but the data rate is reduced to only about 32 ksps.

A high speed mode curve 904 illustrates results for the high speed mode of operation for OSR variables of 2×, 4×, 8×, 16×, 32× and 64×. Generally, the high speed mode curve 904 is substantially similar to the normal mode curve 902 except that for each value of OSR, the data rate is effectively doubled. For example, a data rate of about 2,048 ksps may be achieved at an OSR variable of 2× with 11 bits of accuracy. The high speed mode can produce almost 14 bits of accuracy at a data rate of greater than 64 ksps using an OSR variable of 64×. The high speed mode, however, consumes significantly more power than the normal mode for the same value of OSR. If the normal mode does not provide the sufficient data rate at the desired level of accuracy, then the high speed mode may be used at the expense of increased power consumption.

In the event that accuracy is more important than the data rate, then the high accuracy mode may be used as illustrated by a high accuracy mode curve 906. The high accuracy mode is particularly advantageous when at least 14 bits of accuracy is desired albeit at relatively slow data rates. For example, more than 14 bits of accuracy is achieved at an OSR variable of 64× at only 16 ksps. The high accuracy mode may achieve more than 15 bits of accuracy using OSR variables of 128× or 256× with correspondingly low data rates. Accuracy may be improved to almost 16 bits when digital averaging is employed using the AVG variable greater than 1×. It is noted that in all of the modes, including the normal and high speed modes, a relatively accurate external voltage reference may be used to achieve an ENOB of more than 12 bits.

Figure 10:
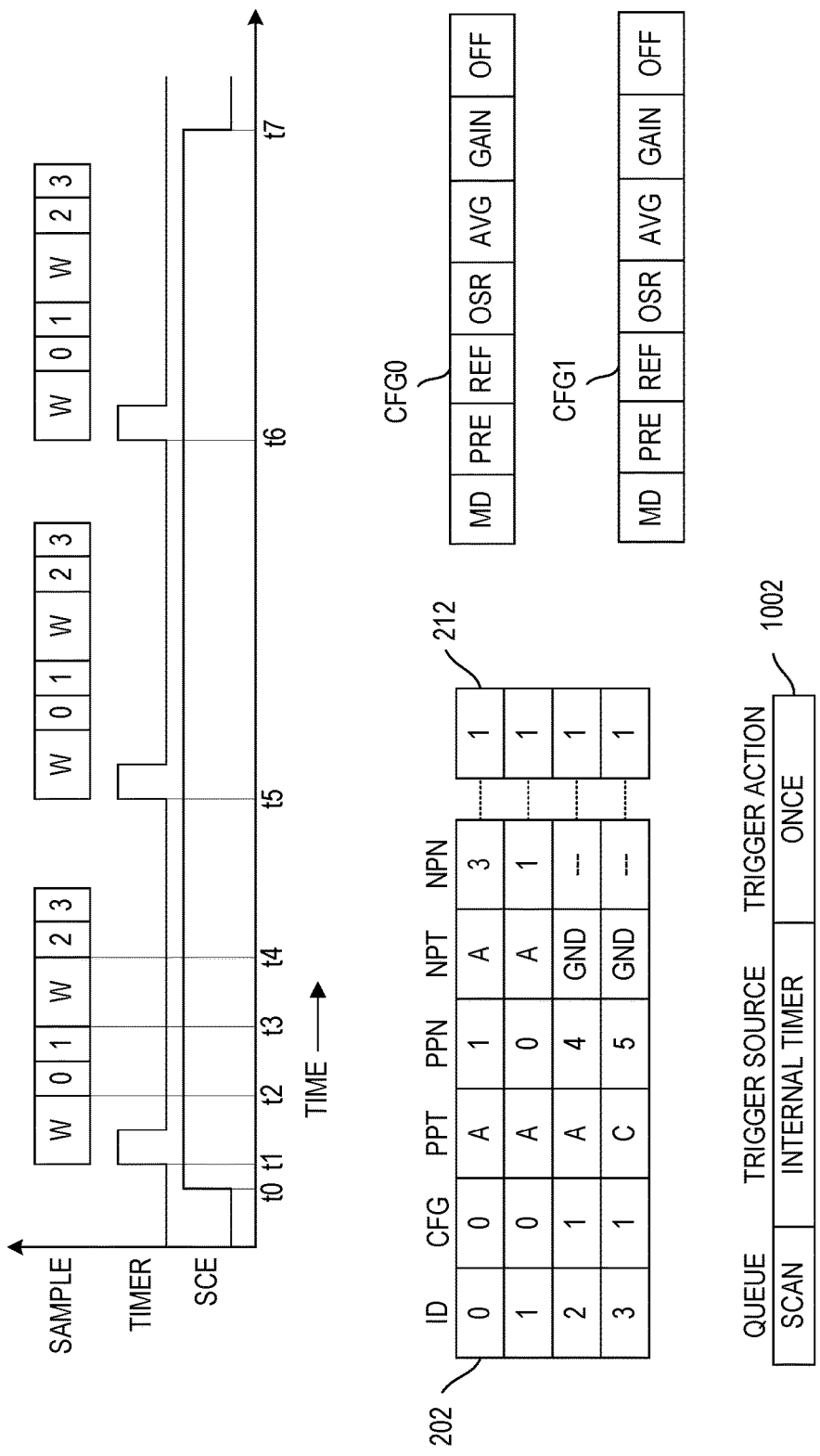
FIGS. 10-13 each include block diagrams showing an exemplary programming and corresponding timing diagrams illustrating operation of the ADC system of FIG. 1 based on the corresponding programming according to various embodiments of the present invention.

FIG. 10 is a block diagram showing an exemplary programming of the scan table 202, the mask register 212, a selected trigger and corresponding trigger action shown in a trigger table 1002, and a corresponding timing diagram illustrating operation of the ADC system 100 for the programmed scan conversion operations according to one embodiment of the present invention. The scan and single conversion operations are initially disabled, so that SCE and SGE (FIG. 3) are initially negated low. Prior to performing the scan conversion operations, the user initializes variables, selections, settings, etc., to setup the ADC system 100 to perform the desired conversion operation. The initialization may be performed by a software application or the like executing on an external device or module interfacing the conversion controller 110 via the external I/F 152 or by any other suitable means configured for a particular embodiment. The initialization is used to program the configuration memory 104 and any other modules, settings, or parameters as described herein for controlling the conversion process.

In one embodiment, the initialization to control parameters of the desired conversion operations includes programming or otherwise configuring the scan table 202, the mask request register 214, the values in the trigger table 1002, one or more configuration registers, such as a first configuration register CFG0 and a second configuration register CFG1, and any other parameters that may be provided for corresponding features. As shown in the scan table 202 illustrated in FIG. 10, a first entry ID0 uses the configuration register CFG0 to convert the voltage between voltage pads A1 and A3, a second entry ID1 uses the configuration register CFG0 to convert the voltage between voltage pads A0 and A1, a third entry ID2 uses the configuration register CFG1 to convert the voltage of voltage pad A4 relative to GND, and a fourth entry ID3 uses the configuration register CFG1 to convert the voltage of voltage pad C5 relative to GND. The user also programs the mask request register 214, which is transferred to the mask register 212 for the scan conversion. As shown in FIG. 10, the mask register 212 is programmed to enable all four entries ID0-ID3. Although not shown, the user configures the external system to provide the desired voltages to the pins of the corresponding ports if not otherwise configured or provided. The user also programs the MD, REF, OSR, AVG, GAIN and OFF variables of each of the selected configuration registers CFG0 and CFG1. Although not shown or described, the user may also enable the ADC 102 by setting an enable bit or the like (not shown). In addition, the user selects the desired trigger source and trigger options and the corresponding clock frequency based on the selected mode of operation.

The trigger table 1002 shows that the internal TIMER trigger is selected for scan conversion operations. In one embodiment, the user programs a time value in a corresponding timer or counter or the like (not shown) to program a given time period between trigger assertions. For example, the internal timer counts down from the programmed time value and asserts a pulse on TIMER upon timeout or expiration, and then the timer resets and repeats. The user may further select other options associated with the selected trigger. As shown in the trigger table 1002, for example, the trigger action is selected as "ONCE" meaning that only one scan conversion operation is performed for each trigger.

Once the initialization is completed, the user prompts a pulse or the like on SCANSTART to enable the scan conversion operation. The timing diagram plots SAMPLE, TIMER and SCE versus time in which "SAMPLE" denotes the timing of the conversion through the ADC 102 to provide a corresponding digital sample. It is noted that the relative timing is simplified to a normalized or unified duration, where it is understood that the actual duration of each SAMPLE period varies with MD, PRE, OSR, AVG, etc. In response to SCANSTART, the SCE is asserted high at a time t0. Once enabled, the next rising edge of TIMER as shown at time t1 initiates the first scan conversion operation. Referring back to FIG. 3, the assertion of the selected trigger (e.g., TIMER) causes SCT to go high, so that the AND gate 308 enables the scan queue pending block 310 and the conversion controller 110 sequentially processes the entries in the scan table 202. Before the first scan conversion begins, however, a warm up process is performed between times t1 and t2 (shown as "W" in the SAMPLE plot) to warm up the AFE 602 and to apply the values from the selected configuration register CFG0 to the ADC 102. After the warm up process ends at time t2, a digital sample is converted for the first entry ID0 (shown as "0" in the SAMPLE plot) to convert the voltage difference between A1 and A3 to a digital sample. Upon completion of the ID0 conversion, the second entry ID1 (shown as "1" in the SAMPLE plot) is immediately started to convert the voltage difference between A0 and A1 to another digital sample. In the illustrated configuration, there is no delay between the ID0 and ID1 digital samples since the ADC 102 is warmed up and programmed with the same values from the same configuration register CFG0.

At time t3 after completion of the ID1 sample at time t3, operation transitions to the third entry ID2 (shown as "2" in the SAMPLE plot) to convert the voltage of A4 relative to GND to a digital sample. However, since entry ID2 uses a different configuration register CFG1 potentially with different configuration variables, another warm up period is inserted after the ID1 sample from time t3 to time t4 to program the ADC 102 with the values from the configuration register CFG1. Upon completion of the warm up period at time t4, the conversion for the third entry ID2 is performed. Immediately after completion of the ID2 conversion to a corresponding sample, another digital sample is converted for the fourth entry ID3 (shown as "2" in the SAMPLE plot) to convert the voltage of C5 relative to GND. The scan conversion operation shows only 4 enabled entries, in which it is understood that any additional entries that are enabled for conversion in the scan table 202 are processed in the same manner. After completion of the enabled entries in the scan table 202, the first scan conversion operation is complete since the trigger action is selected as ONCE.

The next rising edge of TIMER at time t5 initiates a second scan conversion operation since SCE is still high so that scan conversion remains enabled. The second scan conversion operation is essentially the same as the first scan conversion, including an initial warm up period, ID0 and ID1 entry conversions, another warm up period (to transition between configuration registers), and then the ID2 and ID3 conversions. The next rising edge of TIMER at time t6 initiates a third scan conversion operation since SCE is still high so that scan conversion remains enabled. The third scan conversion operation is essentially the same as the first and second scan conversions. Operation may repeat indefinitely in this manner so long as SCE remains enabled. Eventually, as shown at time t7, the user prompts a pulse or the like on SCANSTOP to disable the scan conversion operation, so that SCE is pulled low. Any subsequent assertions of TIMER or any other trigger source are ignored while scan operations are disabled. Once disabled, the user may perform initialization for a different conversion operation.

Figure 11:
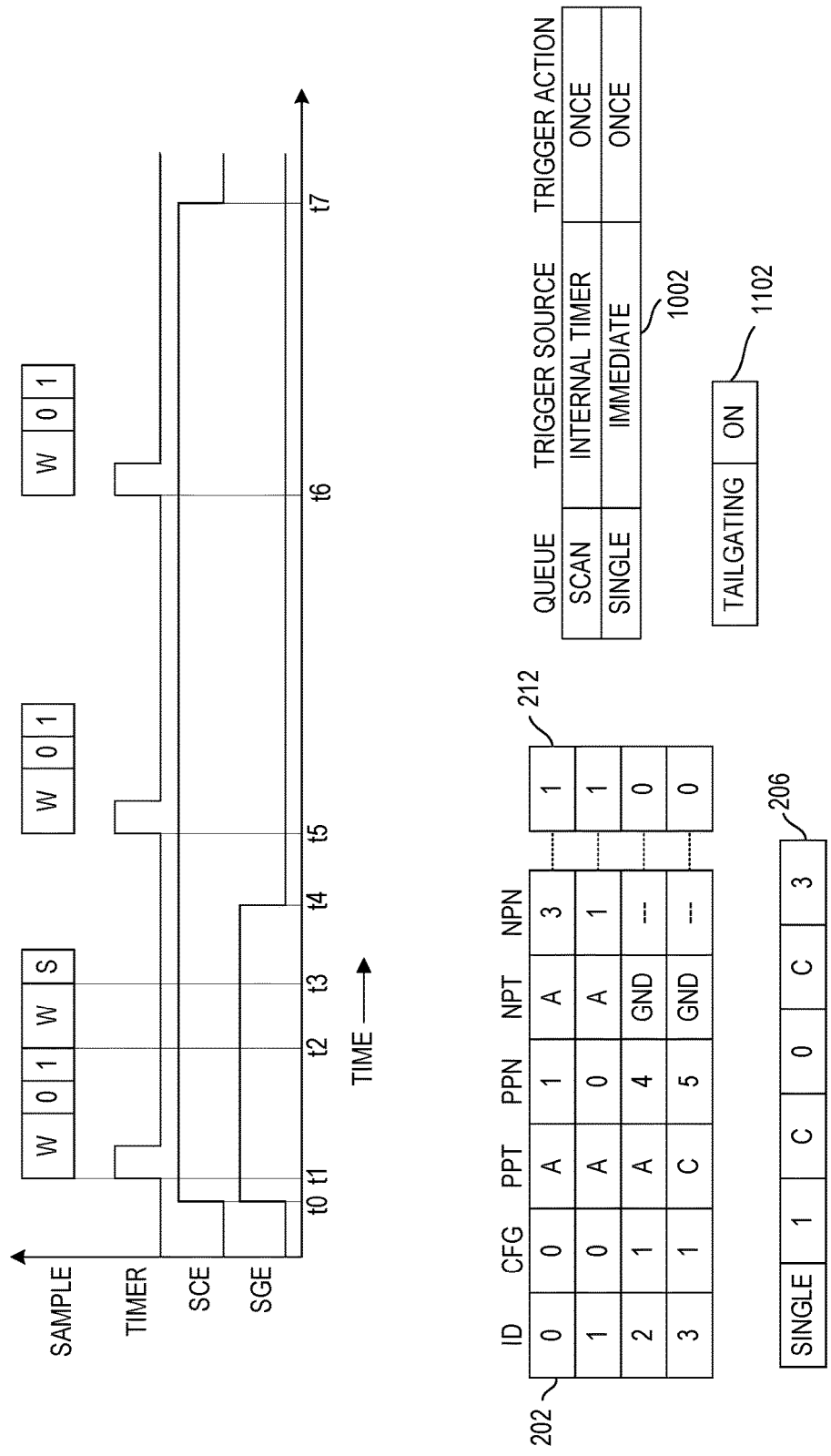

FIG. 11 is a block diagram showing an exemplary programming of the scan table 202, the mask register 212, the single entry 206, selected trigger and corresponding trigger actions in the trigger table 1002, a tailgating setting 1102, and further showing a corresponding timing diagram illustrating operation of the ADC system 100 for the programmed scan and single conversion operations according to one embodiment of the present invention. The timing diagram plots SAMPLE, TIMER, SCE and SGE versus time. Again, the relative SAMPLE timing is simplified to a normalized or unified duration as previously described. The user performs the initialization in a similar manner as previously described. The scan table 202 is programmed with the same values in each of the same entries ID0-ID3 as shown in FIG. 10. The mask register 212, however, only enables the first two entries ID0 and ID1. Although not shown in FIG. 11, the configuration registers CFG0 and CFG1 are used, although the specific configuration variables may be different in the different configuration registers. The single entry 206 is programmed to convert a voltage difference between voltage pads C0 and C3 to a digital sample. The trigger table 1002 is shown illustrating that the internal TIMER is used as the trigger source for scan conversion operations with trigger action of ONCE. The trigger table 1002 an additional entry for selecting the trigger source for the single entry 206 as IMMEDIATE, meaning that triggering is automatically active as soon as the single conversion is active. The trigger action for the single conversion is selected as ONCE. A tailgating setting 1102 is set to ON for single conversion as further described herein.

The user prompts pulse or the like on SCANSTART and SINGLESTART to enable the scan and single conversion operations. In response to SCANSTART and SINGLESTART, the SCE and SGE signals are both asserted high at about the same time t0. When scan and single conversions are both enabled and triggered at the same time, the scan conversions take priority. In the present case, since the single scan is set to immediate, it would otherwise have priority and begin immediately upon assertion of SGE since the scan conversion has not yet been triggered. Tailgating, which is active in the example of FIG. 11, prevents the single conversion from delaying the scan conversions but instead causes the single conversion to follow or piggy-back the scan conversions. At subsequent time t1, TIMER is pulsed high prompting initiation of the scan conversion operation. As previously described for FIG. 10, a warm up period precedes the conversion to warm up the AFE 602 and to program the ADC 102 with the variables of the selected configuration register CFG0. The warm up period is followed by the ID0 and ID1 conversions in a similar manner as shown and described in FIG. 10. Since only these two scan conversion entries are enabled by the mask register 212, and since the trigger action is selected as ONCE, the first scan conversion operation is completed at time t2.

Since tailgating is turned on, the single conversion immediately follows the scan conversion at time t2. If the single entry 206 used the same configuration register CFG0, then there would be no delay and the single conversion may immediately begin. The single entry 206, however, uses a different configuration register CFG1, so that a warm up period is asserted between times t2 and t3. Then the single conversion is performed beginning at time t3 (shown as "S" in the SAMPLE plot), and conversion operations in response to the first TIMER trigger are completed.

At subsequent time t4 prior to a next pulse on TIMER, the SGE signal is negated low to disable the single entry 206. Then the next pulse on TIMER is asserted at subsequent time t5, in which the second scan operation is performed, including a warm up period followed by the ID0 and ID1 conversions. Since the single conversion has been disabled, the current operation is completed after the scan conversion. It is noted that if SGE were still high such that the single conversion was not disabled, then a warm up period and the single conversion would be performed after the ID1 conversion according to tailgating operation. At subsequent time t6, the next pulse on TIMER is asserted and this third scan operation is performed, again including a warm up period followed by the ID0 and ID1 conversions. The SCE signal is negated low at time t7 to disable the scan conversions.

Figure 12:
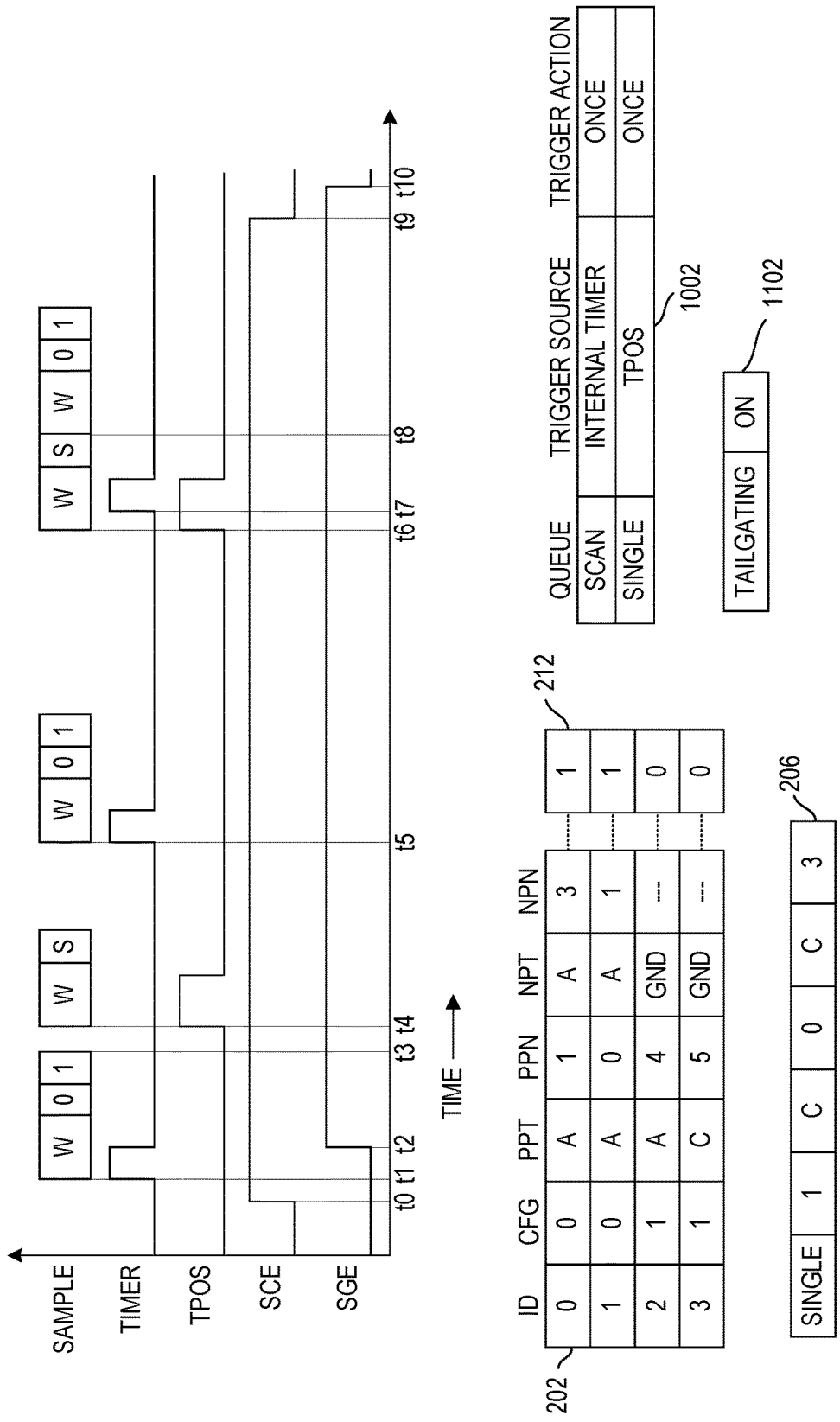

FIG. 12 is a block diagram showing an exemplary programming of the scan table 202, the mask register 212, the single entry 206, selected trigger and corresponding trigger actions in the trigger table 1002, the tailgating setting 1102, and further showing a corresponding timing diagram illustrating operation of the ADC system 100 for the programmed scan and single conversion operations according to one embodiment of the present invention. The configuration of FIG. 12 is similar to that of FIG. 11 in which the scan table 202, the mask register 212 and the single entry 206 are programmed with the same entries and/or configuration variables. The trigger table 1002 again shows TIMER for scan conversions. However, the trigger table 1002 shows TPOS (asynchronous positive edge trigger) as the selected trigger source for the single conversion. The tailgating setting 1102 is off so that single conversion may occur at any time in response to TPOS except when a scan conversion is active. The timing diagram plots SAMPLE, TIMER, TPOS, SCE and SGE versus time. Again, the relative SAMPLE timing is simplified to a normalized or unified duration as previously described. Preliminarily, the user performs the initialization in a similar manner as previously described.

SCE goes high at time t0 while SGE is still low, so that scan conversions are enabled before the single conversion. TIMER is asserted at a time t1, and as previously described, a warm up period precedes the conversion to warm up the AFE 602 and to program the ADC 102 with the variables of the selected configuration register CFG0. The warm up period is followed by the ID0 and ID1 conversions in a similar manner as shown in FIG. 10, in which the first scan conversion completes at time t3. During the first scan conversion before time t3, SGE is asserted high at a time t2 to enable the single conversion. The single conversion is not yet performed since the selected trigger source TPOS has not yet been asserted. At subsequent time t4, TPOS is asserted so that the single conversion begins. An initial warm up period starts at time t4 immediately followed by the single conversion. Subsequently at time t5 after the single conversion has completed, TIMER is asserted again which prompts a second scan conversion including a warm up period followed by the ID0 and ID1 conversions.

Subsequently at time t6, TPOS is asserted high before TIMER is next asserted so that the warm up period and single conversion are performed beginning at time t6. TIMER is asserted at time t7 before completion of the single conversion which was initiated at time t6. In this case, even though the scan conversion has priority, it does not interrupt the single conversion. Immediately following the completion of the single conversion at time t8, the third scan conversion begins including a warmup period followed by the ID0 and ID1 conversions. The SCE and SGE are subsequently negated low at times t9 and t0, respectively.

Figure 13:
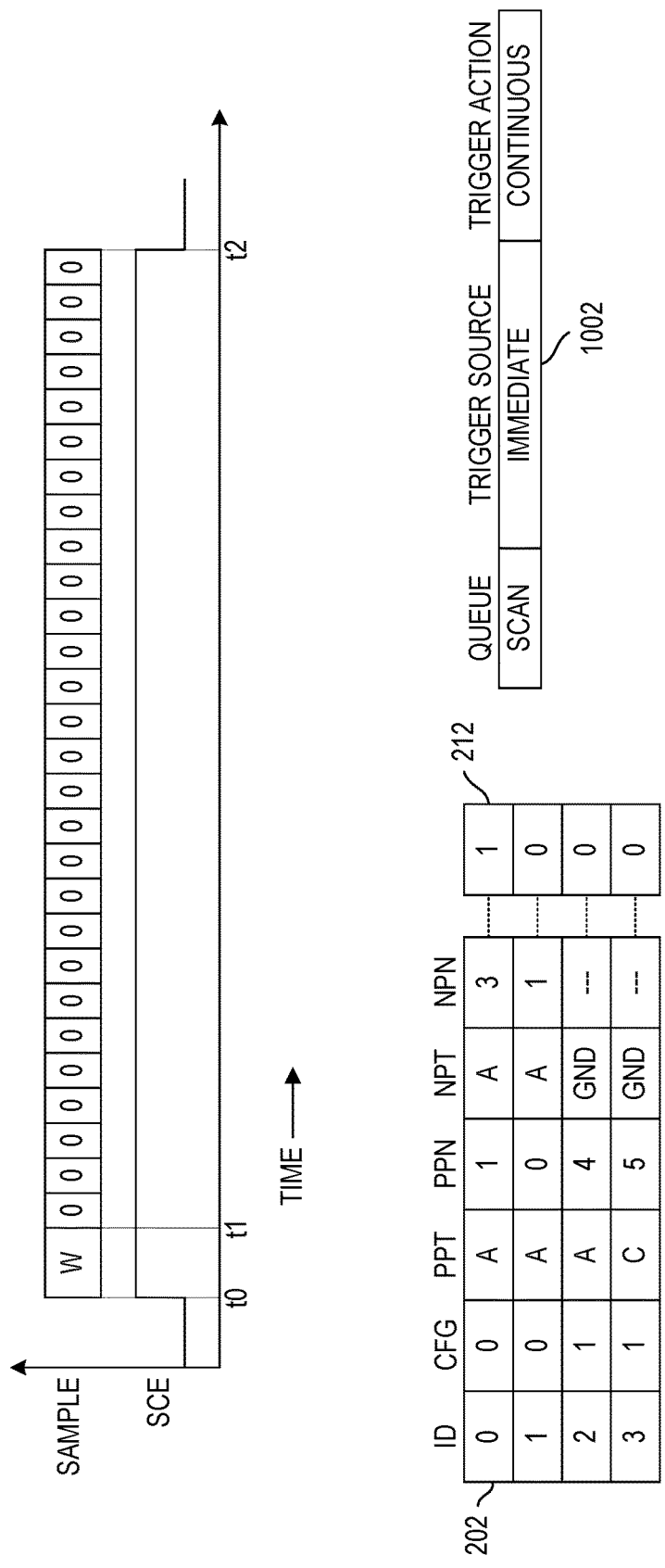

FIG. 13 is a block diagram showing an exemplary programming of the scan table 202, the mask register 212, selected trigger and corresponding trigger actions in the trigger table 1002, and further showing a corresponding timing diagram illustrating operation of the ADC system 100 for the programmed scan and single conversion operations according to one embodiment of the present invention. The scan table 202 is programmed in the same manner as FIG. 12, except that the mask register 212 only enables entry ID0. The trigger table 1002 is programmed to select IMMEDIATE as the trigger source for scan operations, and to select CONTINUOUS for the corresponding trigger action. The timing diagram plots SAMPLE and SCE versus time, and the relative SAMPLE timing is simplified to a normalized or unified duration as previously described.

In this case, as soon as SCE is asserted high at time t0, the scan conversion begins since the trigger source is IMMEDIATE. Again, the scan conversion begins with a warmup period, which is immediate followed by a first ID0 conversion. Since only the ID0 conversion is enabled, the first scan conversion is effectively completed. Since the trigger action is CONTINUOUS, however, the second scan conversion for ID0 begins immediately after the first scan conversion. Since the same configuration register CFG0 is used and since the AFE 602 has already been warmed up, there is no delay between subsequent scan conversions. Thus, the ID0 conversion sequentially repeats in a continuous manner while SCE remains asserted. When SCE is negated at subsequent time t2, the continuous scan operations are terminated. Although not shown, a similar result as shown in FIG. 13 may be achieved using the single entry 206 for continuous conversions with IMMEDIATE and CONTINUOUS trigger settings.

The ADC system 100 provides many advantages and benefits as compared to conventional ADC configurations. Rather than providing multiple ADCs with different operating parameters, such as different speeds and different levels of accuracy at various power consumption levels, a control system is provided for operating a single configurable ADC to perform analog to digital sample conversions according to any of the different operating parameters. The user simply programs a configuration memory with the desired operating variables, such as the analog inputs, operating mode, clock speed (e.g., prescaling), voltage reference, sampling rate, digital averaging, among other digital operating values for one or more different conversion operations. The user also selects a triggering option and enables conversion operation by prompting an enable signal (e.g., SCANSTART or SINGLESTART or the like), and the control system automatically configures the ADC for the conversion operation. In addition, the user may program a list of multiple inputs and corresponding configuration variables, and the control system dynamically reconfigures the ADC and performs the conversions on the fly. There is no need to shut down the ADC to reconfigure it according to the different operating parameters for different conversion operations. The user can even dynamically switch between different input channels with variable speed, accuracy and power consumption on the fly as needed or desired.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A control system for an analog to digital converter, wherein the analog to digital converter comprises an analog input and a digital output and is configurable to adjust a plurality of operating parameters including speed and accuracy, said control system comprising:
a programmable configuration memory that stores at least one configuration variable and an input value;
a trigger selector that enables at least one trigger input;
an input selector that selects from among a plurality of analog inputs according to said input value programmed in said configuration memory; and
a conversion controller that configures the analog to digital converter according to said at least one configuration variable programmed in said configuration memory, that interfaces said input selector to provide a selected analog input to the analog input of the analog to digital converter, and that interfaces the trigger selector to prompt the analog to digital converter to perform a conversion process in response to an enabled trigger input to provide a digital output sample.

2. The control system of claim 1, wherein said programmable configuration memory stores a plurality of entries each comprising a selected configuration variable and at least one selected analog input value for performing a corresponding plurality of conversion processes, wherein said trigger selector enables at least one trigger input for each of said plurality of entries, wherein said input selector selects from among said plurality of analog inputs according to said input value of a corresponding one of said plurality of entries, and wherein said conversion controller dynamically reconfigures said analog to digital converter according to said configuration variable of a corresponding entry between performing each of said plurality of conversion processes.

3. The control system of claim 1, wherein said at least one configuration variable comprises a mode variable for selecting between a normal operating mode, a high accuracy operating mode for increasing an effective number of bits relative to said normal operating mode, and a high speed operating mode for reducing a time for performing said conversion process relative to said normal operating mode.

4. The control system of claim 1, wherein said at least one configuration variable comprises an over-sampling rate variable that determines a number of digital values generated by said analog to digital converter that are combined to develop said digital output sample.

5. The control system of claim 1, wherein said at least one configuration variable comprises a reference variable for selecting from among a plurality of voltage references for use by the analog to digital converter when performing said conversion process.

6. The control system of claim 1, wherein said at least one configuration variable comprises a clock frequency select variable for selecting a clock frequency of said analog to digital converter when performing said conversion process.

7. The control system of claim 1, wherein the analog to digital converter includes an analog front end and a digital pipeline, and wherein said at least one configuration variable comprises an averaging variable used by the digital pipeline for averaging a number of digital values used to provide said digital output sample.

8. The control system of claim 1, wherein the analog to digital converter includes an analog front end and a digital pipeline, wherein said at least one configuration variable comprises a gain variable and an offset variable used by the digital pipeline for adjusting a digital value to provide said digital output sample.

9. The control system of claim 1, wherein said programmable configuration memory comprises:
   a scan table comprising a plurality of programmable entries for sequentially performing a corresponding plurality of conversions when enabled;
   a single programmable entry for performing a single conversion when enabled;
   a queue selector controlled by said conversion controller that selects between said scan table and said single programmable entry; and
   an enable circuit controlled by said conversion controller that enables one of said scan table and said single programmable entry.

10. The control system of claim 1, wherein said programmable configuration memory comprises a plurality of programmable configuration registers, wherein said programmable configuration memory stores a configuration value that identifies one of said plurality of programmable configuration registers, and wherein said identified one of said plurality of programmable configuration registers stores said at least one configuration variable.

11. The control system of claim 1, wherein the analog to digital converter comprises a positive analog input and a negative analog input, and wherein said input value comprises a positive input source and a negative input source for enabling selection between single ended conversions and differential conversions.

12. The control system of claim 1, further comprising:
   at least one buffer for storing said digital output sample; and
   a programmable window comparator that compares said digital output sample with at least one selected digital threshold value.

13. An analog to digital converter system, comprising:
   an analog to digital converter comprising an analog input and a digital output that is configurable for adjusting a plurality of operating parameters including speed and accuracy, wherein said analog to digital converter performs a conversion process to convert an analog value provided at said analog input to a digital output sample provided at said digital output;
   a programmable configuration memory that stores at least one configuration variable and an input value;
   a trigger selector that selects from among a plurality of trigger inputs;
   an input selector that selects from among a plurality of analog inputs according to said input value programmed in said configuration memory; and
   a conversion controller that configures said analog to digital converter according to said at least one configuration variable programmed in said configuration memory, that interfaces said input selector to provide said analog value to said analog input of said analog to digital converter, and that interfaces the trigger selector to prompt said ADC to perform said conversion process in response to a selected trigger input.

14. The analog to digital converter system of claim 13, wherein said analog to digital converter comprises:
   an analog front end comprising a first analog integrator, a second analog integrator, and a quantizer coupled in series for providing first digital values;
   wherein said at least one configuration variable comprises a mode variable that selects between a high accuracy operating mode, a normal operating mode, and a high speed operating mode; and
   wherein said first digital values are developed using said first analog integrator, said second analog integrator, and said quantizer during said high accuracy operating mode, and wherein said first digital values are developed using said first analog integrator and said quantizer during said normal operating mode and said high speed operating mode in which said second analog integrator is bypassed.

15. The analog to digital converter system of claim 14, wherein said analog front end further comprises a successive approximation register that processes a residual value at an output of said first analog integrator during said normal operating mode and during said high speed operating mode.

16. The analog to digital converter system of claim 14, wherein said analog to digital converter comprises:
   a digital pipeline comprising a filter stage including a first digital integrator that accumulates said first digital values to provide second digital values, and a second digital integrator that accumulates said second digital values to provide third digital values; and
   wherein said digital pipeline develops said digital output value using said third digital values during said high accuracy operating mode, and wherein said digital pipeline develops said digital output value using said second digital values during said normal operating mode and said high speed operating mode in which said second digital integrator is bypassed.

17. The analog to digital converter system of claim 16, wherein said at least one configuration variable comprises an over-sampling rate variable, and wherein said conversion controller uses said over-sampling rate variable to determine a number of cycles executed by said analog front end and said filter stage of said digital pipeline.

18. The analog to digital converter system of claim 13, further comprising:
   a reference selector that receives a plurality of voltage references; and
   wherein said at least one configuration variable comprises a reference variable provided to said reference selector to select from said plurality of voltage references to provide a selected voltage reference used by an analog front end of said analog to digital converter.

19. The analog to digital converter system of claim 13, wherein:
   said analog to digital converter comprises an analog front end and a digital pipeline that includes an averaging stage, a gain stage, and an offset stage; and
   wherein said at least one configuration variable comprises a digital averaging variable for use by said averaging stage, a digital gain variable for use by said gain stage, and a digital offset variable for use by said offset stage.

20. The analog to digital converter system of claim 13, wherein said programmable configuration memory comprises:
   a scan table comprising a plurality of programmable entries for sequentially performing a corresponding plurality of conversions when enabled;
   a single programmable entry for performing a single conversion when enabled;

a queue selector controlled by said conversion controller that selects between said scan table and said single programmable entry; and an enable circuit controlled by said conversion controller that enables one of said scan table and said single programmable entry.

21. A method of controlling a configurable analog to digital converter, comprising:

storing at least one configuration variable and an input value in a programmable configuration memory;

selecting and enabling at least one trigger input;

selecting from among a plurality of analog inputs according to the input value stored in the programmable configuration memory;

configuring the analog to digital converter according to the at least one configuration variable stored configuration memory;

providing a selected analog input to the analog input of the analog to digital converter; and prompting the analog to digital converter to perform a conversion process in response to an enabled trigger input to provide a digital output sample.

22. The method of claim 21, wherein:

said storing comprises storing a plurality of entries in the programmable configuration memory, each entry including an input value and at least one configuration variable;

wherein said selecting and enabling at least one trigger input comprises selecting and enabling a trigger input for each of the plurality of entries;

wherein said selecting from among a plurality of analog inputs comprises selecting from among a plurality of analog inputs according to the input value of a corresponding one of the plurality of entries;

wherein said configuring the analog to digital converter comprises dynamically reconfiguring the analog to digital converter according to the at least one configuration variable for each of the plurality of entries;

wherein said providing a selected analog input comprises providing a selected analog input of to the analog input of the analog to digital converter for each of the plurality of entries; and wherein said prompting the analog to digital converter comprises prompting the analog to digital converter to perform a conversion process for each of the plurality of entries in response to a corresponding enabled trigger input of a corresponding one of the plurality of entries to provide a corresponding one of a plurality of digital output samples.

23. The method of claim 21, wherein:

said storing at least one configuration variable comprises storing a mode variable for selecting between a normal operating mode, a high accuracy operating mode for increasing an effective number of bits relative to said normal operating mode, and a high speed operating mode for reducing a time for performing said conversion process relative to said normal operating mode; and wherein said configuring the analog to digital converter comprises configuring the analog to digital converter according to the mode variable.

24. The method of claim 21, wherein the analog to digital converter comprises an analog front end and a digital pipeline, wherein:

said storing at least one configuration variable comprises storing a plurality of digital variables; and wherein said configuring the analog to digital converter comprises configuring the digital pipeline according to each of the plurality of digital variables.

* * * * *

UNITED STATES PATENT AND TRADEMARK OFFICE
CERTIFICATE OF CORRECTION

| | | |
|---|---|---|
| PATENT NO. | : 10,084,469 B1 | Page 1 of 1 |
| APPLICATION NO. | : 15/847403 | |
| DATED | : September 25, 2018 | |
| INVENTOR(S) | : Marty Lynn Pflum | |

It is certified that error appears in the above-identified patent and that said Letters Patent is hereby corrected as shown below:

In the Claims

Within Column 27, replace Lines 15 thru 17 with the following amended line:
--configuring the analog to digital converter according to the at least one configuration variable stored in the programmable configuration memory;--

Signed and Sealed this
Thirtieth Day of October, 2018

Andrei Iancu
*Director of the United States Patent and Trademark Office*